(12) United States Patent
Hirano et al.

(10) Patent No.: US 12,080,996 B2
(45) Date of Patent: Sep. 3, 2024

(54) LASER PROCESSING MACHINE, PROCESSING METHOD, AND LASER LIGHT SOURCE

(71) Applicant: SONY GROUP CORPORATION, Tokyo (JP)

(72) Inventors: Go Hirano, Tokyo (JP); Masanao Kamata, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 427 days.

(21) Appl. No.: 17/428,712

(22) PCT Filed: Feb. 4, 2020

(86) PCT No.: PCT/JP2020/004019
§ 371 (c)(1),
(2) Date: Aug. 5, 2021

(87) PCT Pub. No.: WO2020/166420
PCT Pub. Date: Aug. 20, 2020

(65) Prior Publication Data
US 2022/0006263 A1 Jan. 6, 2022

(30) Foreign Application Priority Data
Feb. 13, 2019 (JP) .................................. 2019-023588

(51) Int. Cl.
*H01S 5/183* (2006.01)
*B23K 26/06* (2014.01)
(Continued)

(52) U.S. Cl.
CPC ...... *H01S 5/18305* (2013.01); *B23K 26/0622* (2015.10); *B23K 26/0661* (2013.01);
(Continued)

(58) Field of Classification Search
CPC . G02B 19/0057; H01S 3/1643; H01S 3/1618; H01S 5/42
See application file for complete search history.

(56) References Cited

U.S. PATENT DOCUMENTS 5,982,802 A 11/1999 Tohony et al.
9,810,775 B1 * 11/2017 Welford .................. G01S 17/10
(Continued)

FOREIGN PATENT DOCUMENTS

CN 1757479 A 4/2006
CN 101112735 A 1/2008
(Continued)

OTHER PUBLICATIONS

International Search Report prepared by the Japan Patent Office on Apr. 13, 2020, for International Application No. PCT/JP2020/004019.

*Primary Examiner* — Edward Chin
(74) *Attorney, Agent, or Firm* — SHERIDAN ROSS P.C.

(57) ABSTRACT

To provide a laser processing machine, a processing method, and a laser light source that are capable of miniaturization. The laser processing machine includes a laser light source and an optical system. The laser light source includes a light emitting body including a substrate and a bottom emission type vertical-cavity surface-emitting laser element that is provided on one surface of the substrate and emits an excitation light beam from another surface side of the substrate, and a cavity that is disposed in contact with the light emitting body on the other surface side of the substrate and oscillates a pulsed laser beam by incidence of the excitation light beam. The optical system causes the pulsed laser beam to contract and applies the pulsed laser beam to a workpiece.

13 Claims, 10 Drawing Sheets

(51) Int. Cl.
    *B23K 26/0622*    (2014.01)
    *G02B 19/00*    (2006.01)
    *G02F 1/35*    (2006.01)
    *H01L 21/268*    (2006.01)
    *H01S 3/0941*    (2006.01)
    *H01S 3/1118*    (2023.01)
    *H01S 3/16*    (2006.01)
    *H01S 5/42*    (2006.01)

(52) U.S. Cl.
    CPC ......... *G02B 19/0047* (2013.01); *G02F 1/353* (2013.01); *H01L 21/268* (2013.01); *H01S 3/0941* (2013.01); *H01S 3/1118* (2013.01); *H01S 3/1618* (2013.01); *H01S 3/1643* (2013.01); *H01S 5/423* (2013.01)

(56) References Cited

U.S. PATENT DOCUMENTS

2007/0217473 A1    9/2007    Abe et al.
2013/0064262 A1    3/2013    Kopf
2016/0099544 A1    4/2016    Hoshino

FOREIGN PATENT DOCUMENTS

| | | |
|---|---|---|
| CN | 101554683 A | 10/2009 |
| CN | 101621173 A | 1/2010 |
| JP | H10-84169 | 3/1998 |
| JP | 2003-053576 | 2/2003 |
| JP | 2003033890 A | 2/2003 |
| JP | 2007-173393 | 7/2007 |
| JP | 2009535796 A | 10/2009 |
| JP | 2013094845 A | 5/2013 |
| JP | 2013252529 A | 12/2013 |
| JP | 2016-076528 | 5/2016 |
| JP | 2018-085469 | 5/2018 |
| WO | WO-2020166420 A1 * | 8/2020    ......... B23K 26/0622 |

* cited by examiner

LASER PROCESSING MACHINE, PROCESSING METHOD, AND LASER LIGHT SOURCE

CROSS REFERENCE TO RELATED APPLICATIONS

This application is a national stage application under 35 U.S.C. 371 and claims the benefit of PCT Application No. PCT/JP2020/004019 having an international filing date of 4 Feb. 2020, which designated the United States, which PCT application claimed the benefit of Japanese Patent Application No. 2019-023588 filed 13 Feb. 2019, the entire disclosures of each of which are incorporated herein by reference.

TECHNICAL FIELD

The present technology relates to a laser processing machine, a processing method, and a laser light source.

BACKGROUND ART

In laser processing, there are demands for performing high-quality processing at high speed and for miniaturization and cost reduction of a processing machine that performs such processing.

There is a laser processing apparatus configured to be capable of emitting a multi-beam in order to speed up laser processing. For example, Patent Literature 1 describes a laser processing apparatus configured to branch a pulse-shaped laser beam output from one laser oscillator by an optical system, supply the laser beams to a plurality of processing heads, and emit a plurality of beams.

CITATION LIST

Patent Literature

Patent Literature 1: Japanese Patent Application Laid-open No. 2003-53576

DISCLOSURE OF INVENTION

Technical Problem

As described in Patent Literature 1, when a multi-beam is obtained by branching a laser beam output from one laser oscillator, a complex optical system for branching the laser beam has been used, and its miniaturization has been difficult.

In view of the circumstances described above, it is an object of the present technology to provide a laser processing machine, a processing method, and a laser light source that are capable of miniaturization.

Solution to Problem

In order to achieve the above object, a laser processing machine according to an embodiment of the present technology includes a laser light source and an optical system.

The laser light source includes a light emitting body including a substrate and a bottom emission type vertical-cavity surface-emitting laser element that is provided on one surface of the substrate and emits an excitation light beam from another surface side of the substrate, and a cavity that is disposed in contact with the light emitting body on the other surface side of the substrate and oscillates a pulsed laser beam by incidence of the excitation light beam.

The optical system causes the pulsed laser beam to contract and applies the pulsed laser beam to a workpiece.

With this configuration, since the bottom emission type vertical-cavity surface-emitting laser element is used, the cavity can be disposed on the other surface side of the substrate that is to be the side from which the excitation light beam is emitted.

The light emitting body may include a plurality of the vertical-cavity surface-emitting laser elements.

The cavity may include a gain medium layer that is excited by the excitation light beams and oscillates laser beams, a supersaturated absorber, and a pair of mirrors sandwiching the gain medium layer and the supersaturated absorber.

The laser processing machine may further include a wavelength conversion layer provided between the laser light source and the optical system.

The laser processing machine may further include a transparent member provided between the optical system and the workpiece and having a different thickness for each portion.

The light emitting body may include a condensing member that condenses and emits the excitation light beams to the cavity.

The light emitting body may include a collimating member that collimates and emits the excitation light beams, and a condensing member that condenses and emits light emitted from the collimating member to the cavity.

The laser processing machine may further include a controller that controls oscillation of the pulsed laser beams from the laser light source.

The controller may individually control emission of the pulsed laser beams based on the excitation light beams respectively emitted from the plurality of vertical-cavity surface-emitting laser elements.

The gain medium layer may be Yb:YAG.

The supersaturated absorber may be Cr:YAG.

A laser processing method according to an embodiment of the present technology includes, by using a laser processing machine including a laser light source including a light emitting body including a substrate and a plurality of bottom emission type vertical-cavity surface-emitting laser elements that is provided on one surface of the substrate and emits excitation light beams from another surface side of the substrate, and a cavity that is disposed in contact with the light emitting body on the other surface side of the substrate and oscillates a plurality of pulsed laser beams by incidence of the excitation light beams, and an optical system that causes the pulsed laser beams to contract and applies the pulsed laser beams to a workpiece, processing the workpiece by irradiating the workpiece with the pulsed laser beams at respectively different oscillation timings, the pulsed laser beams being oscillated on the basis of the excitation light beams respectively emitted from the vertical-cavity surface-emitting laser elements adjacent to each other.

The oscillation timings of the pulsed laser beams based on the excitation light beams respectively emitted from the vertical-cavity surface-emitting laser elements adjacent to each other may be shifted by a half period of a pulse period of the pulsed laser beams.

A laser processing method according to an embodiment of the present technology includes, by using a laser processing machine including a laser light source including a light emitting body including a substrate and a plurality of bottom emission type vertical-cavity surface-emitting laser elements that is provided on one surface of the substrate and emits excitation light beams from another surface side of the substrate, and a cavity that is disposed in contact with the light emitting body on the other surface side of the substrate and oscillates a plurality of pulsed laser beams by incidence of the excitation light beams, an optical system that causes the pulsed laser beams to contract and applies the pulsed laser beams to a workpiece, and a wavelength conversion layer provided between the laser light source and the optical system, processing the workpiece by irradiating the workpiece with a pulsed laser beam that is emitted from the cavity and does not pass through the wavelength conversion layer and a pulsed laser beam having a wavelength converted by passing through the wavelength conversion layer.

A laser processing method according to an embodiment of the present technology includes, by using a laser processing machine including a laser light source including a light emitting body including a substrate and a plurality of bottom emission type vertical-cavity surface-emitting laser elements that is provided on one surface of the substrate and emits excitation light beams from another surface side of the substrate, and a cavity that is disposed in contact with the light emitting body on the other surface side of the substrate and oscillates a plurality of pulsed laser beams by incidence of the excitation light beams, an optical system that causes the pulsed laser beams to contract and applies the pulsed laser beams to a workpiece, and a transparent member provided between the optical system and the workpiece and having a different thickness for each portion, processing the workpiece by irradiating the workpiece with a plurality of pulsed laser beams formed by the transparent member and having different focal lengths.

A laser processing method according to an embodiment of the present technology includes, by using a laser processing machine including a laser light source including a light emitting body including a substrate and a plurality of bottom emission type vertical-cavity surface-emitting laser elements that is provided on one surface of the substrate and emits excitation light beams from another surface side of the substrate, and a cavity that is disposed in contact with the light emitting body on the other surface side of the substrate and oscillates a plurality of pulsed laser beams by incidence of the excitation light beams, an optical system that causes the pulsed laser beams to contract and applies the pulsed laser beams to a workpiece, a wavelength conversion layer provided between the laser light source and the optical system, and a transparent member provided between the optical system and the workpiece and having a different thickness for each portion, processing the workpiece formed by stacking a first material to be processed at a first processing wavelength and a second material to be processed at a second processing wavelength, the first processing wavelength and the second processing wavelength being different from each other, by irradiating the workpiece with a first pulsed laser beam having the first processing wavelength that is emitted from the cavity and does not pass through the wavelength conversion layer and a second pulsed laser beam having the second processing wavelength converted by passing through the wavelength conversion layer, with focal lengths varied by the transparent member such that a focal position of the first pulsed laser beam is on the first material and a focal position of the second pulsed laser beam is on the second material.

A laser light source according to an embodiment of the present technology includes a light emitting body and a cavity.

The light emitting body includes a substrate and a bottom emission type vertical-cavity surface-emitting laser element that is provided on one surface of the substrate and emits an excitation light beam from another surface side of the substrate.

The cavity is disposed in contact with the light emitting body on the other surface side of the substrate and oscillates a pulsed laser beam by incidence of the excitation light beam.

MODE(S) FOR CARRYING OUT THE INVENTION

Hereinafter, a laser processing machine, a laser light source, and a laser processing method of the present technology will be described with reference to embodiments. Similar components will be denoted by similar reference symbols, and description of the components that have already been described will be omitted in some cases.

First Embodiment

[Configuration of Laser Processing Machine]

An embodiment of a laser processing machine according to the present technology will be described.

Figure 1:
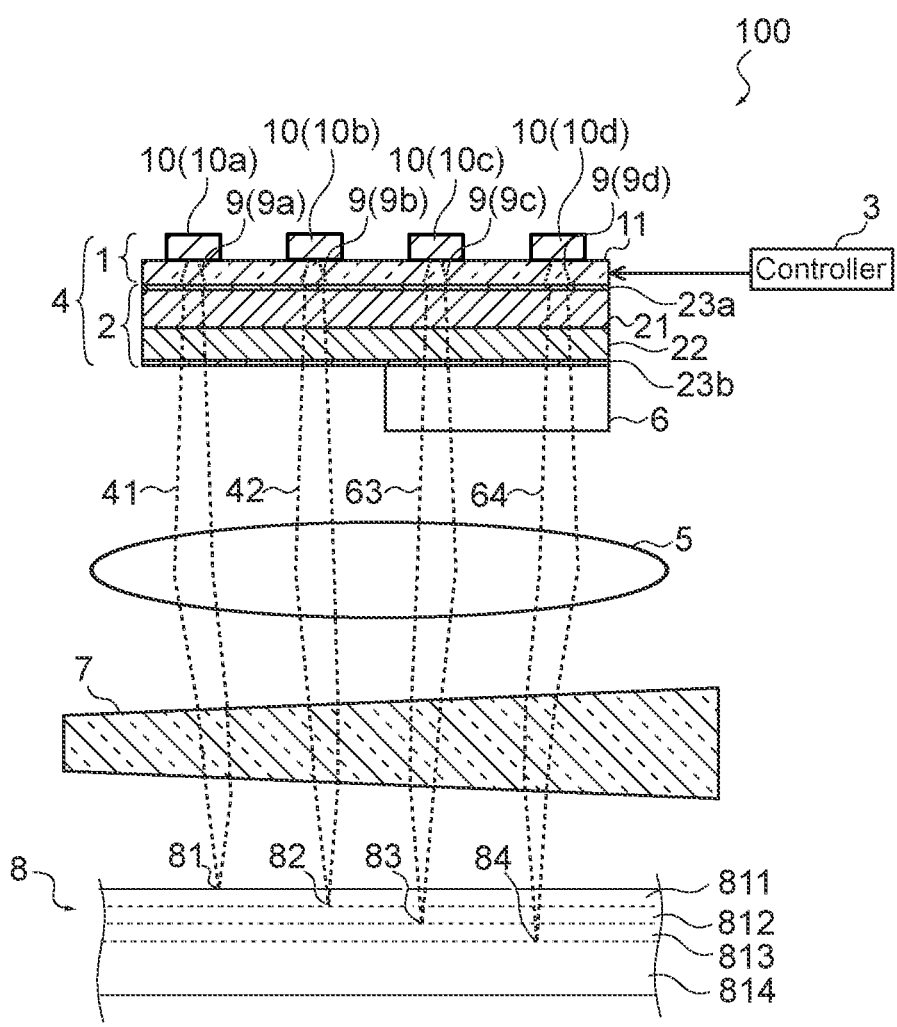
FIG. 1 is a schematic cross-sectional view of a laser processing machine according to an embodiment of the present technology.

FIG. 1 is a schematic cross-sectional view of a laser processing machine according to the present technology.

As shown in FIG. 1, a laser processing machine 100 includes a laser light source 4, an optical system 5, a wavelength conversion layer 6, and a transparent member 7 having a different thickness for each portion. The laser processing machine 100 according to this embodiment irradiates a workpiece 8 with a plurality of ultrashort pulsed laser beams and performs drilling, grooving, dividing processing, or the like on the workpiece 8. As the workpiece 8, for example, a semiconductor substrate or the like is used, and can be subjected to fine processing.

The laser light source 4 is a multi-beam microchip laser light source that emits a plurality of ultrashort pulsed laser beams (hereinafter, sometimes referred to as pulsed laser beams) having a pulse width in the picosecond range (1 ps to 1000 ps). The laser light source 4 is capable of emitting a plurality of pulsed laser beams in the picosecond range in an array.

The laser light source 4 includes a plurality of vertical-cavity surface-emitting laser elements (hereinafter, sometimes referred to as VCSEL elements) 10a to 10d. The VCSEL elements 10a to 10d respectively have the same structures. The VCSEL elements 10a to 10d emit excitation light beams 9a to 9d, respectively.

In this embodiment, the four VCSEL elements are denoted by reference symbols 10a to 10d, but if there is no need to particularly distinguish from each other, they will be described as the VCSEL element(s) 10. Similarly, if there is no need to distinguish the excitation light beams 9a to 9d from each other, they will be described as the excitation light beam(s) 9.

Further, in this embodiment, a configuration in which the four VCSEL elements 10a to 10d are one-dimensionally arranged will be described as an example, but the number and arrangement of VCSEL elements 10 are not limited to this. The number of VCSEL elements 10 may be one or two or more. Further, a plurality of VCSEL elements may be disposed in a two-dimensional array.

The laser light source 4 emits a pulsed laser beam having a high power density in the picosecond range and having a beam diameter of approximately 100 μm, for example.

The configuration of the laser light source 4 will be described later.

The optical system 5 is a reducing optical system that reduces the beam diameter of the pulsed laser beam when the pulsed laser beam emitted from the laser light source 4 is incident on the workpiece 8, to form an image on the image plane. The optical system 5 reduces the beam diameters of a plurality of pulsed laser beams 41, 42, 63, and 64 while maintaining the spatial distribution of those pulsed laser beams, and irradiates the workpiece 8 with each pulsed laser beam.

In this embodiment, since the plurality of pulsed laser beams is oscillated from the laser light source 4, it is not necessary to provide an optical system for branching one laser beam so as to obtain a plurality of pulsed laser beams to be applied to a workpiece. Thus, it is possible to provide a simple and compact optical system 5, to reduce the size of the laser light source 4, and also to reduce the cost. Further, the reduction in size of the laser light source 4 makes it possible to reduce the size of the entire laser processing machine 100.

The wavelength conversion layer 6 is disposed between the laser light source 4 and the optical system 5. When the wavelength conversion layer 6 is provided, the wavelength conversion layer 6 converts the wavelength of the pulsed laser beam emitted from the laser light source 4. Thus, it is possible to obtain a laser beam having a shorter wavelength.

The wavelength conversion layer 6 is, for example, disposed to correspond to a portion of the emission surface for the pulsed laser beams of the laser light source 4 so as to convert the wavelengths of part of pulsed laser beams among a plurality of pulsed laser beams emitted from the laser light source 4.

The wavelength conversion layer 6 can be configured to have a planar surface and can be arranged on a picosecond generating cavity 2 (which will be described later in detail) of the laser light source 4 that can also be configured to have a planar surface such that both the planar surfaces are in contact with each other.

When the wavelength conversion layer 6 is provided, it is possible to collectively irradiate the workpiece 8 with pulsed laser beams of different wavelengths.

For example, if the workpiece 8 includes a plurality of materials having different absorption wavelengths, processing wavelengths suitable for the respective materials may be different. In this embodiment, since the workpiece 8 can be collectively irradiated with pulsed laser beams of different processing wavelengths, processing of the respective materials can be collectively performed by the same laser processing machine.

Further, when the wavelength conversion layer 6 is provided, it is possible to obtain a plurality of pulsed laser beams having different wavelengths from one laser light source 4. Thus, it is not necessary to provide multiple laser light sources for the respective pulsed laser beams having different wavelengths, and it is possible to reduce the cost of the laser processing machine.

The wavelength conversion by the wavelength conversion layer 6 is related to the power density of the pulsed laser beam to be incident. In this embodiment, a pulsed laser beam having a high power density in the picosecond range and having a beam diameter of approximately 100 μm is incident on the wavelength conversion layer 6 from the laser light source 4, so that efficient wavelength conversion becomes possible.

Further, since the wavelength conversion layer 6 can be disposed in contact with the laser light source 4, the pulsed laser beam oscillated from the laser light source 4 is efficiently incident on the wavelength conversion layer 6, so that the light utilization efficiency can be increased.

For the wavelength conversion layer 6, for example, a crystal having known nonlinear optical characteristics (nonlinear optical crystal) can be used singly or in combination. Using the wavelength conversion layer 6, the fundamental wave can be converted to have a wavelength of SHG (second harmonic generation, second harmonic), THG (third harmonic generation, third harmonic), FHG (fourth harmonic generation, fourth harmonic), or the like.

Examples of the nonlinear optical crystal to be used include KTP, KDP, DKDP, ADP, β-BBO, CBO, YCOB, GdCOB, GdYCOB, LiNO3, AgGaSe, KTA, CLBP, LBO, LB4, KN, and AgGaS.

Further, as the wavelength conversion layer 6, a QPM element configured using a quasi-phase matching method for the nonlinear optical crystals described above can be used. The QPM element includes a wavelength conversion element having a periodic polarization inversion structure in a crystal, and is capable of wavelength conversion with high efficiency.

For example, in the QPM element, the wavelength of a pulsed laser beam oscillated from the laser light source 4 is converted into a second harmonic (SHG) by a second harmonic conversion unit formed of a first nonlinear crystal. Further, there is a method of generating a third harmonic as a sum frequency generation by a third harmonic conversion unit formed of a second nonlinear crystal while using the second harmonic converted by the second harmonic conversion unit and a pulsed laser beam that has not been converted into the second harmonic by the second harmonic conversion unit, and then converting the pulsed laser beam into a third harmonic (THG).

In the example shown in FIG. 1, the pulsed laser beams 41 and 42 that are emitted from the laser light source 4 and are not transmitted through the wavelength conversion layer 6 have a first wavelength. Meanwhile, the pulsed laser beams 63 and 64 that are emitted from the laser light source 4 and transmitted through the wavelength conversion layer 6 have a second wavelength different from the first wavelength.

Thus, in the laser processing machine 100 of this embodiment, it is possible to irradiate the workpiece 8 with a plurality of pulsed laser beams having wavelengths different from each other from one laser light source 4 that oscillates a plurality of pulsed laser beams having the same wavelength, using the wavelength conversion layer 6.

The transparent member 7 having a different thickness for each portion (hereinafter, referred to as transparent member in some cases) is provided between the optical system 5 and the workpiece 8. The pulsed laser beams emitted from the laser light source 4 and transmitted through the optical system 5 are incident on the transparent member 7.

The transparent member 7 has a different thickness for each portion, and in this embodiment, has a tapered shape in which the thickness gradually decreases from the right to the left in the drawing. Note that the transparent member 7 may have a stepped shape with stepwise different thicknesses.

Depending on the thickness of a portion where the pulsed laser beam passes through the transparent member 7, the focal length of each pulsed laser beam is different, and the focal position of the workpiece 8 where each pulsed laser beam is applied is different. As described above, the transparent member 7 having different thicknesses for the respective portions forms a plurality of pulsed laser beams having different focal lengths.

For example, in the example shown in FIG. 1, the pulsed laser beam 41, which is oscillated on the basis of the excitation light beam 9a from the VCSEL element 10a, is applied to a position 81 of the workpiece 8 as a focal position.

The pulsed laser beam 42 based on the excitation light beam 9b from the VCSEL element 10b is applied to a position 82 of the workpiece 8 as a focal position.

The pulsed laser beam 63 based on the excitation light beam 9c from the VCSEL element 10c is applied to a position 83 of the workpiece 8 as a focal position.

The pulsed laser beam 64 based on the excitation light beam 9d from the VCSEL element 10d is applied to a position 84 of the workpiece 8 as a focal position.

The positions 81 to 84 are located at different distances from each other from the emission surface of the laser light source 4.

Thus, in the laser processing machine 100 of this embodiment, it is possible to irradiate the workpiece 8 with a plurality of pulsed laser beams having focal lengths different from each other from one laser light source 4 that oscillates a plurality of pulsed laser beams, using the transparent member 7 having a different thickness for each portion.

As the thickness of the transparent member 7 through which light is to be transmitted becomes thinner, the focal length becomes shorter.

Use of the transparent member 7 capable of changing the focal length of each pulsed laser beam makes it possible to process a workpiece at different depth positions and to efficiently perform processing such as drilling, grooving, or cutting of a thick workpiece.

The focal length of each pulsed laser beam can be appropriately adjusted depending on the thickness of the transparent member 7 through which the pulsed laser beam passes. When the transparent member 7 is configured to be interchangeable in the laser processing machine, even if the workpiece 8 is changed, efficient processing can be performed with a transparent member 7 suitable for the workpiece 8 that has changed.

Furthermore, in the laser processing machine 100 of this embodiment, it is possible to irradiate the workpiece 8 with pulsed laser beams having different wavelengths from one laser light source 4 that oscillates a plurality of pulsed laser beams having the same wavelength while varying the focal lengths using the wavelength conversion layer 6 and the transparent member 7.

[Configuration of Laser Light Source]

Next, description will be given on the laser light source 4 with reference to FIGS. 1 to 3.

Figure 2:
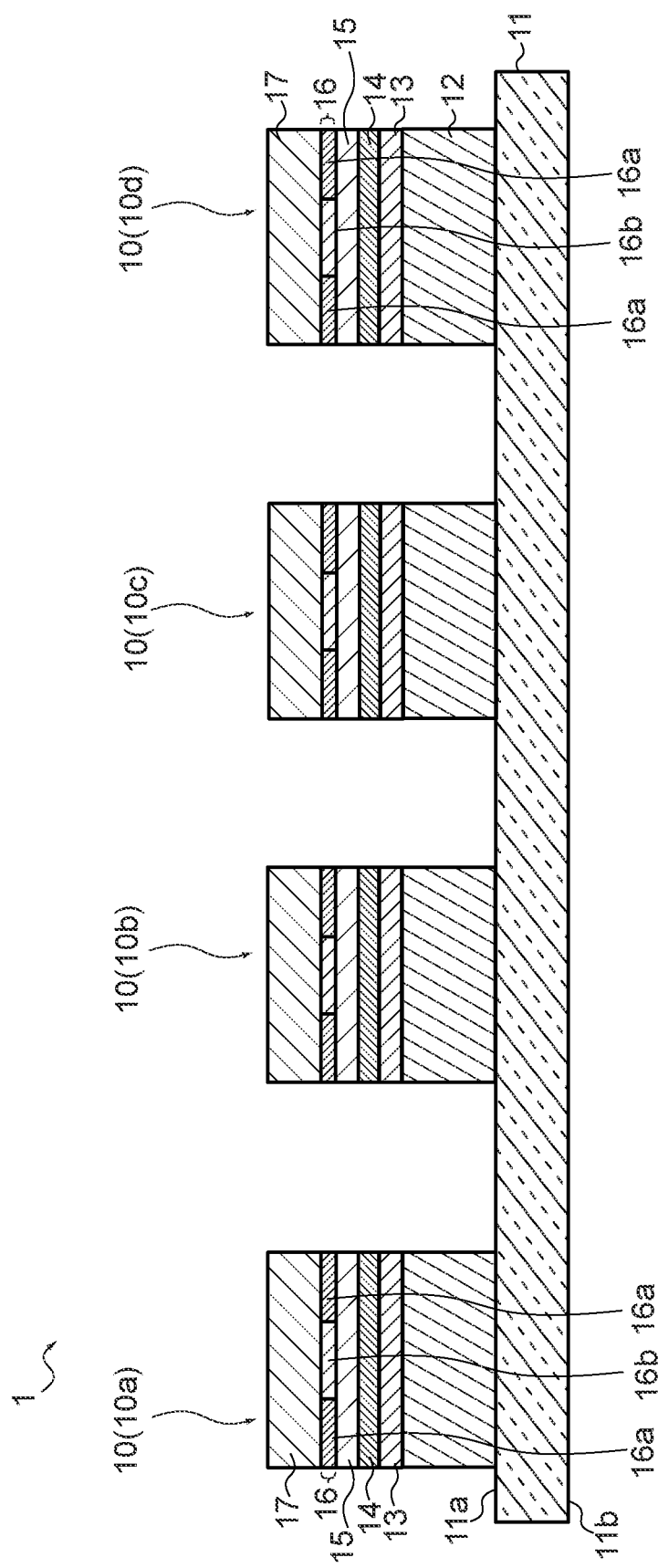
FIG. 2 is a schematic cross-sectional view of a light emitting body constituting a part of the laser processing machine.

FIG. 2 is a schematic cross-sectional view of a light emitting body 1.

Figure 3:
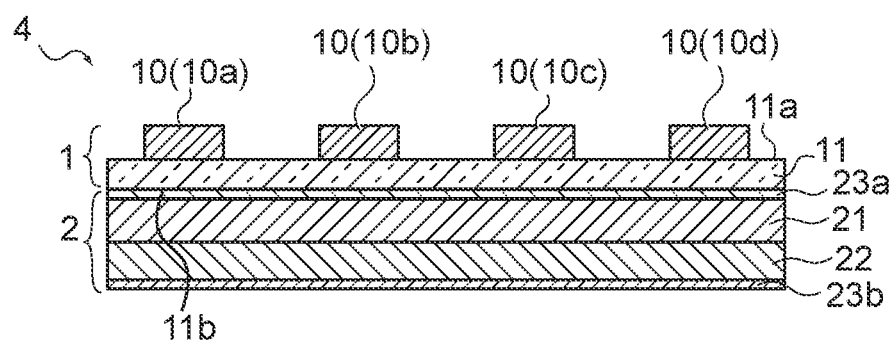
FIG. 3 is a schematic cross-sectional view of a laser light source according to a first embodiment.

FIG. 3 is a partially enlarged view of the laser processing machine 100 and is a schematic cross-sectional view of the laser light source 4.

As shown in FIG. 1, the laser light source 4 includes the light emitting body 1 that is a semiconductor laser element substrate, a picosecond generating cavity 2, and a controller 3. The laser light source 4 is a laser oscillator for emitting a plurality of pulsed laser beams having a pulse width in the picosecond range (1 ps to 1000 ps). For example, use of an ultrashort pulsed laser beam having a short pulse width in the picosecond range or the like makes it possible to reduce a thermally fused region of a workpiece and perform non-thermal processing, and to achieve high-quality processing.

(Light Emitting Body)

The light emitting body 1 is an excitation light source that emits the excitation light beam 9.

As shown in FIG. 2, the light emitting body 1 includes a plurality of, in this embodiment, four VCSEL elements 10a to 10d, and is configured to be capable of emitting a plurality of, in this embodiment, four excitation light beams 9a to 9d.

The plurality of VCSEL elements 10 is formed on the same substrate 11 using a photolithography technique. For example, a plurality of VCSEL elements is formed on the substrate 11 and subjected to cutting, so that it is possible to collectively produce a plurality of light emitting bodies 1, to achieve mass production, and to reduce the cost.

In the following, the detailed structure of the VCSEL element 10 will be described, but this is merely an example, and the present technology is not limited to the structure described below.

As shown in FIG. 2, each VCSEL element 10 includes the substrate 11, an n-distributed Bragg reflector (DBR) layer 12, an n-cladding layer 13, an active layer 14, a p-cladding layer 15, a constriction layer 16, a p-DBR layer 17, an n-electrode (not shown), and a p-electrode (not shown). The VCSEL elements 10a to 10d share the substrate 11.

The substrate 11 supports each layer of the VCSEL element 10. The substrate 11 has one surface 11a and the other surface 11b facing each other.

The four VCSEL elements 10a to 10d share the substrate 11. The light emitting body 1 has a configuration in which the plurality of VCSEL elements 10 is provided on the one surface 11a of the same substrate 11.

The VCSEL element 10 can be produced with a positional accuracy of 1 μm or less. The plurality of VCSEL elements 10 is arranged at narrow pitches of, for example, 100 μm to 1 mm. The plurality of VCSEL elements 10 is configured to be controllable by the controller 3 independently of each other.

In this embodiment, the VCSEL element 10 is of a bottom emission type (backside illumination type), and the excitation light beam 9 emitted from the VCSEL element 10 is emitted from the other surface 11b.

Since the bottom emission type has higher output than the top emission type, it is favorable to use the bottom emission type.

When the bottom emission type VCSEL element 10 is used, a cooling unit for cooling the light emitting body 1 is provided on the VCSEL element 10 side, i.e., the substrate front side. Meanwhile, when the cooling unit is provided to a light emitting body using a top emission type VCSEL element, the cooling unit is provided on the substrate 11 side, i.e., the substrate back side.

When the case where the cooling unit is arranged on the substrate front side of the light emitting body 1 and the case where the cooling unit is arranged on the substrate back side of the light emitting body 1 are compared with each other, the distance between the cooling unit and the active layer 14 is shorter in the case of arranging the cooling unit on the substrate front side.

That is, it is possible to cool the active layer 14 by the cooling unit more efficiently using the bottom emission type VCSEL element 10 than using the top emission type VCSEL element.

Thus, by using the bottom emission type VCSEL element 10, it is possible to arrange the cooling unit so as to be positioned closer to the active layer 14, and to suppress more efficiently the temperature rise of the active layer 14, which causes lowering of the maximum light output, an increase of the degradation rate of the excitation light source, or the like.

A heat sink or the like can be used for the cooling unit.

Further, since the bottom emission type VCSEL element 10 is used, a cavity can be disposed in contact with the light emitting body 1 on the substrate back side (the other surface 11b side of the substrate) that is to be the side from which the excitation light is emitted. Therefore, it is possible to attach the picosecond generating cavity 2 to the light emitting body 1, to reduce the size of the laser light source 4, and to reduce the size of the laser processing machine 100.

The n-DBR layer 12 is provided on the substrate 11 that is a semiconductor substrate, and functions as a distributed Bragg Reflector (DBR) that reflects light having a wavelength λ.

The n-cladding layer 13 is a layer that is stacked on the n-DBR layer 12 and confines light and current in the active layer 14.

The active layer 14 is provided on the n-cladding layer 13 and emits and amplifies spontaneous emission light. The active layer 14 includes quantum well layers having a small band gap and barrier layers having a large band gap, which are alternately stacked.

The p-cladding layer 15 is a layer that is provided on the active layer 14 and confines light and current in the active layer 14.

The constriction layer 16 is provided on the p-cladding layer 15 and imparts a constricting action to the current. The constriction layer 16 includes an oxidized region 16a and a non-oxidized region 16b. The oxidized region 16a has low conductivity and a small refractive index and functions as a light-confining region. The non-oxidized region 16b has higher conductivity than the oxidized region 16a and functions as a current injection region.

The p-DBR layer 17 is provided on the constriction layer 16 and functions as a DBR that reflects light having a wavelength λ.

The n-electrode is formed in contact with the n-DBR layer 12 and functions as one electrode of the VCSEL element 10. The p-electrode is formed on the p-DBR layer 17 and functions as the other electrode of the VCSEL element 10. The p-electrode and the n-electrode are formed of any conductive material.

When a voltage is applied between the n-electrode and the p-electrode, a current flows between the n-electrode and the p-electrode. The current is subjected to a constricting action by the constriction layer 16 and injected into the non-oxidized region 16b.

The injected current generates spontaneous emission light in a region of the active layer 14, which is adjacent to the non-oxidized region 16b. The spontaneous emission light travels in the stacking direction of the VCSEL element 10 (in the direction perpendicular to the layer), and is reflected by the n-DBR layer 12 and the p-DBR layer 17.

The n-DBR layers 12 and the p-DBR layers 17 are configured to reflect light having a particular wavelength (hereinafter, the oscillating wavelength). Components having an oscillating wavelength in the spontaneous emission light form standing waves between the n-DBR layer 12 and the p-DBR layer 17, and are amplified by the active layer 14. The n-DBR layer 12 and the p-DBR layer 17 constitute a cavity for laser oscillation.

When the injected current exceeds a threshold value, the light that forms the standing waves performs laser oscillation, and is transmitted through the n-cladding layer 13, the n-DBR layer 12, and the substrate 11 and is emitted from the other surface 11b.

In this embodiment, the emission wavelength band of the VCSEL element 10 is set to 940 nm, but the present technology is not limited thereto.

(Picosecond Generating Cavity)

As shown in FIGS. 1 and 3, the picosecond generating cavity 2 serving as a cavity is provided in contact with the other surface 11b of the substrate 11 of the light emitting body 1.

In this embodiment, since the bottom emission type VCSEL element 10 is used, the picosecond generating cavity 2 can be disposed in contact with the substrate 11 that is to be the side from which the excitation light of the light emitting body 1 is emitted, and the size of the laser light source 4 can be reduced.

The picosecond generating cavity 2 and the light emitting body 1 may be fully joined by, for example, joining at room temperature, or may be fixed in contact with each other by a housing (not shown).

The picosecond generating cavity 2 oscillates an ultrashort pulsed laser beam having a pulse width in the picosecond region by the incidence of the excitation light beam 9 emitted from the light emitting body 1.

The picosecond generating cavity 2 includes a gain medium 21 that is a laser medium, a supersaturated absorber 22, and a pair of cavity mirrors 23a and 23b.

When the gain medium 21 absorbs a certain amount of the excitation light, stimulated emission exceeds the absorption, and amplification of the laser light occurs.

In this embodiment, an example of using, as the gain medium 21, Yb:YAG for oscillating a laser beam having a wavelength of 1030 nm will be described, for example. The picosecond generating cavity 2 oscillates a pulsed laser beam having a wavelength of 1030 nm.

Examples of the gain medium 21 to be used include, in addition to Yb:YAG, Nd:YAG, Nd:YVO$_4$, Nd:YLF, Nd:glass, Yb:YAG, Yb:YLF, Yb:FAP, Yb:SFAP, Yb:YVO, Yb:glass, Yb:KYW, Yb:BCBF, Yb:YCOB, Yb:GdCOB, and YB:YAB.

It is favorable to use Yb:YAG, Nd:YVO$_4$, or Nd:YAG as the gain medium 21, and it is particularly favorable to use Yb:YAG.

The oscillation wavelength of Yb:YAG is 1030 nm. The oscillation wavelengths of Nd:YVO4 and Nd:YAG are each 1064 nm.

Yb:YAG are YAG crystals doped with Yb$^{3+}$.

Yb:YAG can be excited even by an excitation light beam having small output power of several W. Therefore, when the VCSEL element 10 that emits an excitation light beam having relatively small output power is used as an excitation light source, it is favorable to use crystals that can be excited by small output power, such as Yb:YAG crystals, as the gain medium 21.

Further, Yb:YAG is favorable because it has an effective excitation wavelength range of 935 nm to 945 nm, has a wide absorption bandwidth, and can broaden a request wavelength range for the excitation light beam emitted from the VCSEL element 10 of the light emitting body 1 serving as the excitation light source, so that the yield can be improved.

Further, Yb:YAG has a long fluorescence lifetime of 960 µs.

Nd:YVO$_4$ are YVO$_4$ crystals doped with Nd$^{3+}$.

Nd:YVO$_4$ has an effective excitation wavelength range of 805 nm to 813 nm, has a wide absorption bandwidth, and can broaden a request wavelength range for the excitation light beam emitted from the VCSEL element 10 of the light emitting body 1 serving as the excitation light source, so that the yield can be improved.

Nd:YAG are YAG crystals doped with Nd$^{3+}$.

The pair of cavity mirrors 23a and 23b are disposed facing each other across the gain medium 21 and the supersaturated absorber 22. The cavity mirrors 23a and 23b are respectively formed by coating one surface of the gain medium 21 and one surface of the supersaturated absorber 22 with mirrors.

When light reciprocates in the gain medium 21 between the pair of cavity mirrors 23a and 23b, the stimulated emission amplifies the light.

In this embodiment, the cavity mirror 23a, which is a rear mirror positioned on the side on which the excitation light beams 9 are incident, is configured to reflect all of the laser beams having a wavelength of 1030 nm and prevent reflection of the laser beam having a wavelength of 940 nm.

On the other hand, the cavity mirror 23b, which is an output mirror positioned on the side where the laser beam is oscillated with respect to the workpiece 8, is configured to reflect part of the laser beam having a wavelength of 1030 nm, and to output part of the laser beams having a wavelength of 1030 nm reciprocating in the picosecond generating cavity 2 to the outside.

The supersaturated absorber 22 is a passive Q-switch and can switch the Q-value (figure of merit) of the picosecond generating cavity 2. The supersaturated absorber 22 is a crystal in which the transmittance of the laser beam is low when the energy stored therein is small, and the transmittance increases when the energy exceeds a threshold value.

The gain medium 21 and the supersaturated absorber 22 are disposed in contact with each other and bonded to each other.

In the Q-switch method, the Q value is lowered until a very large number of atoms of the gain medium 21 is in the excited state to suppress the oscillation of the pulsed laser beam, and after the number is sufficiently increased, a high Q value is increased to oscillate the pulsed laser beam.

When the intensity of the laser beam oscillated from the gain medium 21 is small, the transmittance of the supersaturated absorber 22 is low, and the laser beam is not oscillated from the picosecond generating cavity 2. On the other hand, when the intensity of the laser beam oscillated from the gain medium 21 is increased, and the energy of the laser beam exceeds a unique threshold value determined by the configuration of the supersaturated absorber 22, the transmittance of the supersaturated absorber 22 is increased. When the transmittance of the supersaturated absorber 22 is increased, the laser beam can be transmitted through the supersaturated absorber 22, and the laser beam is oscillated from the picosecond generating cavity 2.

Thus, the supersaturated absorber 22 functions as an opening and closing shutter for controlling the oscillation of the pulsed laser beam, and when the energy is sufficiently accumulated in the gain medium, switches the Q value of the picosecond generating cavity 2 in a short time to instantaneously oscillate a large-output pulsed laser beam.

A material having a Q-switch function can be used as the supersaturated absorber 22. For example, Cr:YAG that is a YAG crystal doped with Cr$^{4+}$ or V:YAG that is a YAG crystal doped with V$^{3+}$ can be used.

Here, the plurality of VCSEL elements 10 can be produced on the same substrate 11 using a photolithography technique and has a configuration having a planar surface. Further, the picosecond generating cavity 2 is configured by stacking the gain medium 21 and the supersaturated absorber 22, each of which has one mirror-coated surface, and has a configuration having a planar surface.

Therefore, the light emitting body 1 and the picosecond generating cavity 2 can be disposed with the surfaces thereof being in contact with each other. Thus, for example, it is possible to produce a laminate by a stacking process such as stacking the gain medium 21 and the supersaturated absorber 22 respectively mirror coated on the back side of a semiconductor substrate on which a plurality of VCSEL elements 10 is formed (the substrate prior to being divided into the substrates 11), to divide the laminate, and collectively produce a plurality of laser light sources 4 including a plurality of VCSEL elements 10.

Thus, it is possible to perform mass production and significantly reduce the cost of the laser light source.

(Controller)

The controller 3 independently controls the driving of each of the plurality of VCSEL elements 10 provided in the light emitting body 1, and controls the timings of the emission of the excitation light beams from the respective VCSEL elements 10. Thus, the timings of the oscillation of the plurality of pulsed laser beams applied from the laser light source 4 to the workpiece 8 on the basis of the excitation light beams emitted from the respective VCSEL elements 10 can be individually controlled for each pulsed laser beam.

[Processing Method]

Figure 4:
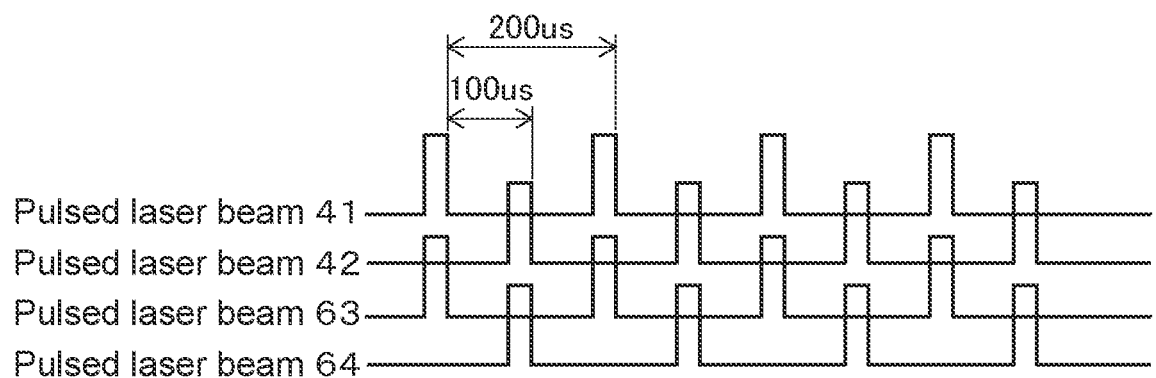
FIG. 4 is a diagram for describing the irradiation timings of pulsed laser beams.

FIG. 4 is a diagram showing oscillation timings of the pulsed laser beams 41, 42, 63, and 64 oscillated from the laser processing machine 100 on the basis of the excitation light beams emitted from the four VCSEL elements 10.

FIG. 4 shows, from the top, the irradiation timings of the pulsed laser beam 41 that is oscillated on the basis of the excitation light beam 9a emitted from the VCSEL element 10a, the pulsed laser beam 42 that is oscillated on the basis of the excitation light beam 9b emitted from the VCSEL element 10b, the pulsed laser beam 63 that is oscillated on the basis of the excitation light beam 9c emitted from the VCSEL element 10c, and the pulsed laser beam 64 that is oscillated on the basis of the excitation light beam 9d emitted from the VCSEL element 10d.

As shown in FIG. 4, the irradiation timings of the pulsed laser beams oscillated on the basis of the VCSEL elements 10 adjacent to each other are different. More specifically, the emission timings of the excitation light beams 9 of the respective VCSEL elements 10 are controlled by the controller 3 such that the excitation light beams 9 are applied to be shifted by a half period of the pulse period.

In such a manner, the workpiece is processed by controlling the irradiation timings of the pulsed laser beams adjacent to each other to be varied, and thus it is possible to reduce the influence of heat and to perform high-quality processing.

In laser processing, use of a picosecond pulsed laser beam having a short pulse width, i.e., a short irradiation time makes it possible to perform non-thermal processing in which the influence of heat is reduced. However, when the VCSEL elements 10 are disposed at narrow pitches, and for example, when processing is performed at the same irradiation timings of the pulsed laser beams adjacent to each other, the processing mode may change from non-thermal processing to thermal processing due to the influence of heat.

In this embodiment, the irradiation timings of the pulsed laser beams adjacent to each other are controlled to be different, and for example, as shown in FIG. 4, the irradiation with the pulsed laser beams adjacent to each other is controlled to be performed alternately, and thus the influence due to thermal accumulation is reduced, and the non-thermal processing can be performed. Therefore, high-quality laser processing can be performed.

In the irradiation with the pulsed laser beam 41 based on the VCSEL element 10a, the time in which the heat stays in an irradiation region of the workpiece 8 is represented by t. In order to reduce the influence of heat, the start of irradiation with the pulsed laser beam 42 based on the VCSEL element 10b next to the VCSEL element 10a needs to be set to a time after the elapse of time longer than the time t from the irradiation time with the pulsed laser beam 41.

The time t varies depending on the material of the workpiece, and the repetition frequency of the pulsed laser beam in the laser light source 4 is set on the basis of the time t. The repetition frequency is assumed as 1/t.

In the example shown in FIG. 4, the pulsed laser beams 41, 42, 63, and 64 are driven at 5 kHz, and the pulse period is 200 μs. The irradiation timings of the adjacent pulsed laser beams are controlled so as to be shifted by 100 μs, which is a half period of the pulse period. For example, the start of irradiation of the pulsed laser beam 42 based on the VCSEL element 10b is delayed or precedes by 100 μs from the start of irradiation of the pulsed laser beam 41 based on the VCSEL element 10a positioned next thereto.

In such a manner, processing is performed by shifting the irradiation timings of the adjacent pulsed laser beams, and thus it is possible to hardly generate thermal accumulation and to reduce the thermal damage of the workpiece caused by thermal accumulation.

In this embodiment, the configuration in which the four VCSEL elements 10a to 10d are one-dimensionally arranged has been described as an example. In the case of the laser light source formed by two-dimensionally arranging a plurality of VCSEL elements 10, in order to suppress the influence of heat as described above, it is favorable to arrange VCSEL elements so as to reduce the number of pulsed laser beams adjacent to each other at the time of irradiation.

Figure 5:
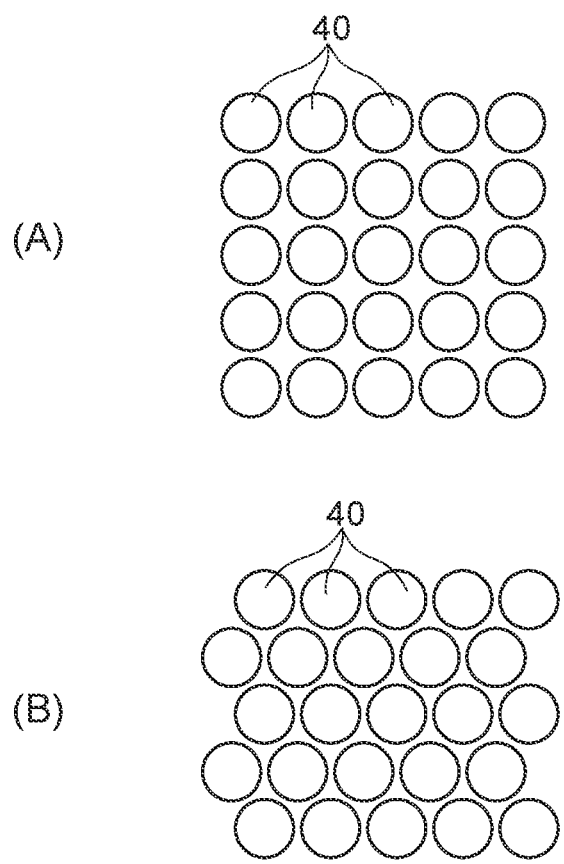
FIG. 5 is a diagram for describing a positional relationship, of the pulsed laser beams applied to a workpiece, based on a plurality of vertical-cavity surface-emitting laser elements.

FIG. 5 is a diagram for describing the positions of irradiation spots 40 of the pulsed laser beams oscillated from the laser light source formed by arranging the plurality of VCSEL elements 10.

(A) of FIG. 5 shows a case where the VCSEL elements 10 are arranged in an array, and (B) of FIG. 5 shows a case where the VCSEL elements 10 are arranged in a staggered array.

In the arrangement example shown in (B) of FIG. 5, the distance between one irradiation spot (hereinafter, referred to as the central irradiation spot 40) and six irradiation spots 40 located surrounding it is equally spaced, and the number of irradiation spots 40 adjacent to the central irradiation spot is six.

In contrast, in the arrangement example shown in (A) of FIG. 5, among eight irradiation spots 40 surrounding one irradiation spot 40 (hereinafter, referred to as the central irradiation spot 40), four irradiation spots 40 adjacent to the central irradiation spot 40 in the vertical and horizontal directions in the drawing are located closer to the central irradiation spot 40 than the four irradiation spots 40 adjacent thereto in the other oblique directions. Therefore, the number of irradiation spots 40 close and adjacent to the central irradiation spot is four.

As described above, the arrangement example shown in (B) of FIG. 5 has a larger number of close and adjacent irradiation spots than the arrangement example shown in (A) of FIG. 5 as seen from the central irradiation spot 40, and is thus susceptible to the influence of heat as described above. Therefore, in order to perform thermal processing by reducing the influence of heat, there are many restrictions on the design matters relating to the processing, such as lowering a processing speed.

On the other hand, in the arrangement example shown in (A) of FIG. 5, the number of close and adjacent irradiation spots is smaller than that in the arrangement example shown in (B) of FIG. 5, so that the design matters relating to the processing can be widened.

Therefore, when a plurality of VCSEL elements is arranged, it is favorable to employ the array-like arrangement shown in (A) of FIG. 5 in which the number of close and adjacent irradiation spots is reduced.

Figure 6:
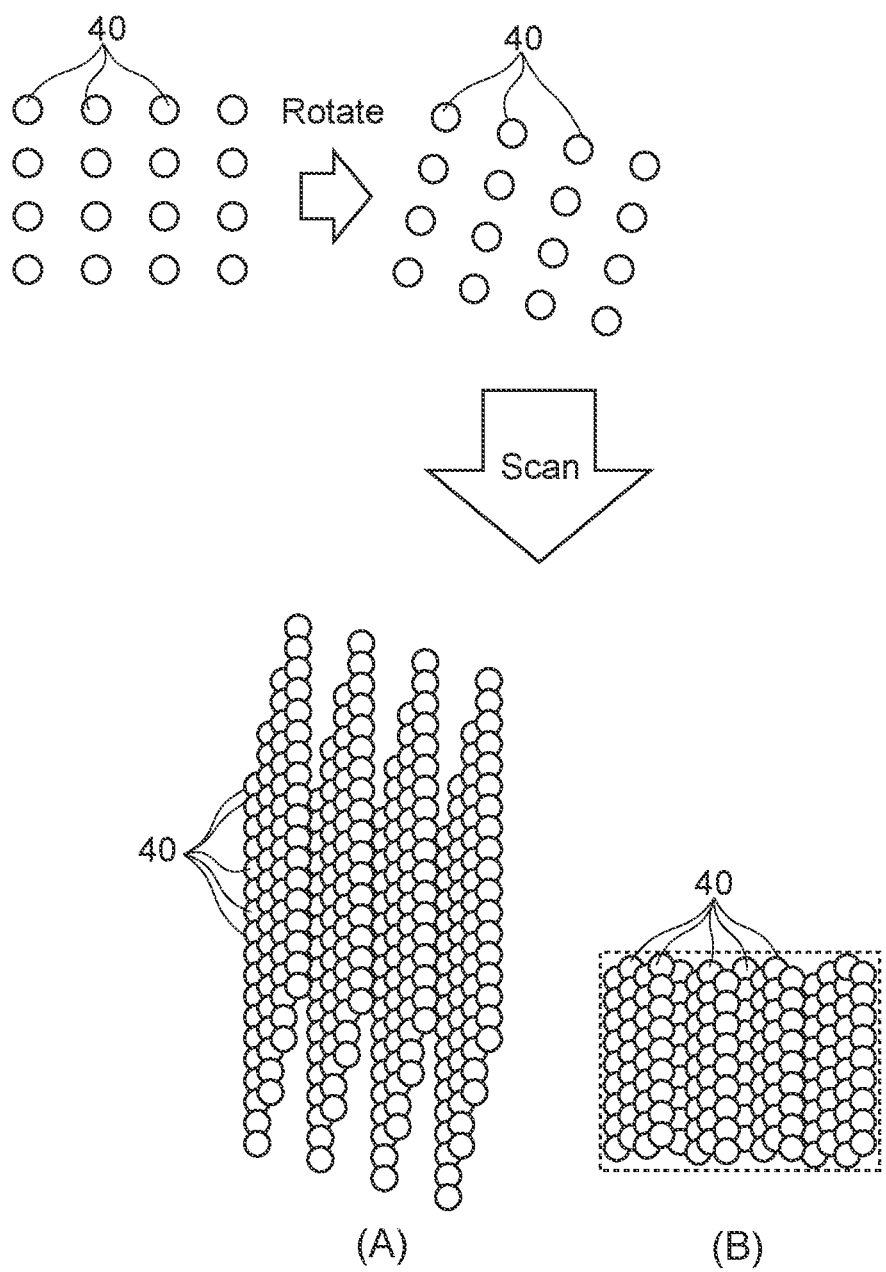
FIG. 6 is a diagram for describing an example of a processing method.

FIG. 6 is for describing an example of the irradiation spots 40 of the pulsed laser beams in the case of using a laser light source formed by two-dimensionally arranging a plurality of VCSEL elements 10.

(A) of FIG. 6 shows the positions of the irradiation spots 40 when the excitation light beams are simultaneously emitted from all the VCSEL elements 10 and the laser light source is moved.

(B) of FIG. 6 shows the positions of the irradiation spots 40 when the emission of the excitation light beams from the VCSEL elements 10 is individually controlled and the laser light source is moved.

Note that it may be possible to move the laser light source and then apply the pulsed laser beams, or to fix the laser light source, move the workpiece, and then apply the pulsed laser beams.

As shown in (A) of FIG. 6, when scanning is performed so as to move the laser light source, for example, rotate it on the same plane, it is possible to apply the pulsed laser beams so as to fill gaps between the adjacent irradiation spots 40, and high-speed processing can be performed.

Further, as shown in (B) of FIG. 6, the VCSEL elements 10 are driven independently by the controller 3, and thus it is possible to define the irradiation range of the pulsed laser beam with respect to the workpiece, and to process the workpiece in the processing region of a desired shape. Thus, it is possible to control the processing region by independently driving the VCSEL elements 10. In the example shown in (B) of FIG. 10, the processing region has a substantially rectangular shape surrounded by a chain line.

By using the laser processing machine 100 of this embodiment, it is possible to collectively process a workpiece formed by stacking a plurality of materials having different absorption wavelengths. When the absorption wavelengths are different, processing wavelengths suitable for the respective materials may be different. Since the laser processing machine 100 of this embodiment include the wavelength conversion layer 6 and the transparent member 7, the workpiece 8 can be irradiated with pulsed laser beams having different wavelengths with different focal lengths, and thus it is possible to batch processing.

For example, as shown in FIG. 1, it is assumed that the workpiece 8 is formed by stacking four layers 811 to 814 formed of a plurality of materials having different absorption wavelengths in the thickness direction. The layers 811 and 812 are formed of materials to be processed using a first wavelength, which is the same as or close to its absorption wavelength, as the processing wavelength. The layers 813 and 814 are formed of materials to be processed using a second wavelength, which is the same or close to its absorption wavelength, as the processing wavelength. The first processing wavelength and the second processing wavelength are different wavelengths.

In this embodiment, when the wavelength conversion layer 6 and the tapered transparent member 7 are provided, the pulsed laser beam 41 is applied to the surface of the layer 811 as a focal position 81, and processing is performed on the layer 811. The pulsed laser beam 42 is applied to a position 82 on the surface of the layer 812 being in contact with the layer 811 as a focal position, and processing is performed on the layer 812.

As a result, the layer 811 and the layer 812 are respectively efficiently processed by the pulsed laser beams 41 and 42 having the first wavelength suitable for processing the materials.

The pulsed laser beam 63 is applied to a position 83 on the surface of the layer 813 being in contact with the layer 812 as a focal position, and processing is performed on the layer 813. The pulsed laser beam 64 is applied to a position 84 on the surface of the layer 814 being in contact with the layer 813 as a focal position, and processing is performed on the layer 814.

As a result, the layer 813 and the layer 814 are respectively efficiently processed by the pulsed laser beams 63 and 64 having the second wavelength suitable for processing the materials.

Thus, use of a pulsed laser beam suitable for processing of each material of a workpiece makes it possible to perform efficient processing.

As described above, using the laser processing machine 100 including the wavelength conversion layer 6 and the tapered transparent member 7, it is possible to collectively irradiate the workpiece 8 with the pulsed laser beams having different wavelengths at different focal positions. Thus, efficient processing can be performed, and high-quality processing can be performed at high speed.

Further, the laser processing machine 100 may be a laser processing machine including a laser light source 4, an optical system 5, and a wavelength conversion layer 6 without a transparent member 7.

Such a laser processing machine is capable of performing processing by irradiating a workpiece with a plurality of pulsed laser beams having wavelengths different from each other. Thus, it is possible to collectively process each material of a workpiece formed of a plurality of materials having different processing wavelengths.

Figure 7:
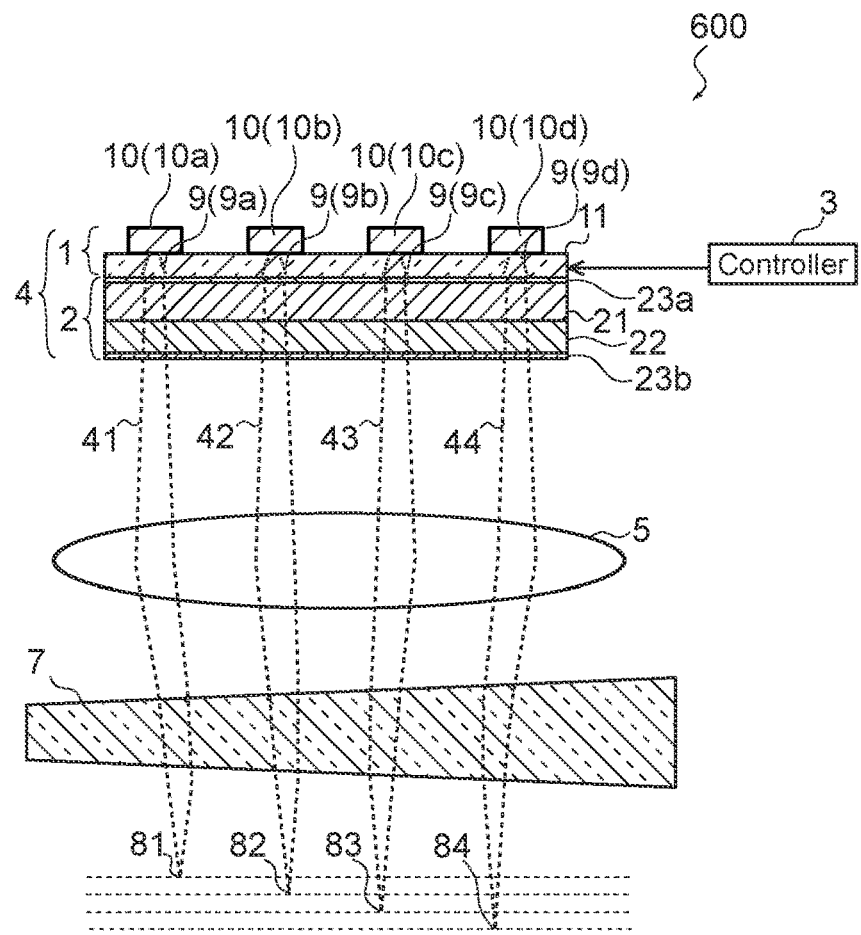
FIG. 7 is a schematic cross-sectional view of another laser processing machine.

Further, using a laser processing machine shown in FIG. 7 including a laser light source 4, an optical system 5, and a transparent member 7 having a different thickness for each portion and including no wavelength conversion layer 6, it is possible to perform processing by irradiating a workpiece with a plurality of pulsed laser beams with different focal lengths.

FIG. 7 is a schematic cross-sectional view of a laser processing machine 600 including a laser light source 4, an optical system 5, and a tapered transparent member 7.

Figure 8:
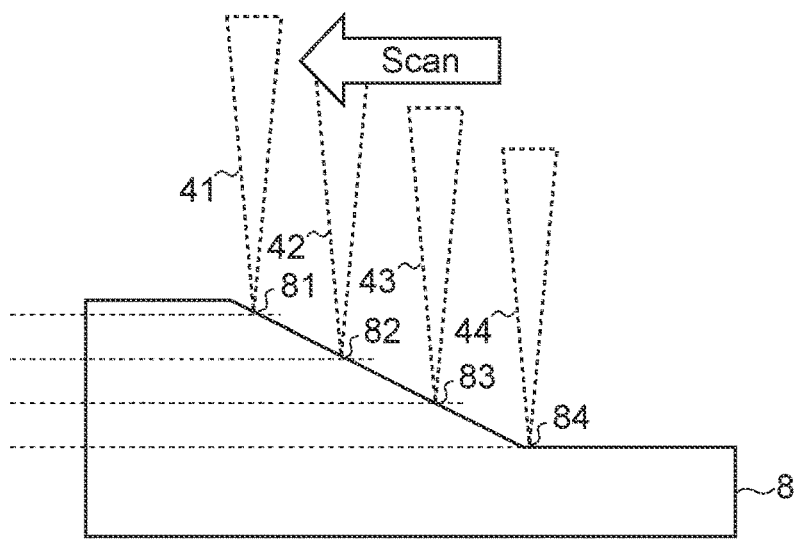
FIG. 8 is a diagram for describing a state during processing of a workpiece.

FIG. 8 is an example of a workpiece 8 to be processed using the laser processing machine 600 and is a schematic cross-sectional view of the workpiece 8.

As shown in FIG. 7, when the tapered transparent member 7 is provided, the focal length from the laser light source 4 to each of the focal positions 81 to 84 can be varied for each of the pulsed laser beams 41 to 44. Note that the laser processing machine 600 does not include the wavelength conversion layer 6, and thus the pulsed laser beams 41 to 44 have the same wavelength.

Using the tapered transparent member 7, the workpiece 8 is processed while varying the focal length of each of the pulsed laser beams 41 to 44. Thus, it is possible to easily perform drilling, grooving, or cutting on a thick workpiece.

For example, when processing is performed using a single pulsed laser beam, it is conceivable to perform processing by performing scanning a plurality of times to vary the focal length while moving the laser light source that oscillates the pulsed laser beam. In this method, the scanning has to be performed by changing the focal length, and it takes time.

In contrast, in the laser processing machine 600, the tapered transparent member 7 is provided, which makes it possible to process the workpiece 8 collectively while varying the focal lengths of a plurality of pulsed laser beams. Thus, it is possible to speed up the processing.

Further, when the focal length of each of the pulsed laser beams 41 to 44 is varied using the tapered transparent member 7, for example, as shown in FIG. 8, it is possible to scan the workpiece 8 whose processing surface is a tapered surface firstly with the pulsed laser beam 41 having a short focal length, and continuously perform processing different in the depth direction, thus performing efficient processing.

The thickness of the transparent member 7 may be varied for each portion in accordance with the shape of the surface to be processed of the workpiece 8.

The repetition frequency of the pulsed laser beam is, for example, favorably 50 kHz or less, and more favorably 10 kHz or less. Further, the power of the pulsed laser beam is favorably a 1 J/cm$^2$ or less, and more favorably a 0.5 J/cm$^2$. As a result, the occurrence of thermal processing is suppressed, and high-quality processing becomes possible.

As described above, by using an ultrashort pulsed laser beam like a picosecond pulsed laser beam, it is possible to reduce the thermally fused region of the workpiece and perform non-thermal processing.

However, the non-thermal processing or thermal processing also depends on the repetition frequency of the pulsed laser beam and the power of the pulsed laser beam. Thus, if the repetition frequency is increased to speed up the processing, the thermal processing is performed due to the thermal accumulation. If the power is increased, the thermal processing is performed even in the case of using an ultrashort wave pulse.

So, in order to suppress the occurrence of thermal processing, it is favorable to set the repetition frequency and the power as described above. Note that the numerical values of the repetition frequency and the power of the pulsed laser beam described here are examples. The numerical values vary for each material to be processed, and are not limited to the numerical values described above.

In this embodiment, using the laser light source 4 in which the light emitting body 1 including a plurality of VCSEL elements 10 formed on the same substrate is used as an excitation light source, the irradiation positional accuracy of the pulsed laser beam oscillated from the laser light source 4 can be made highly accurate.

Figure 13:
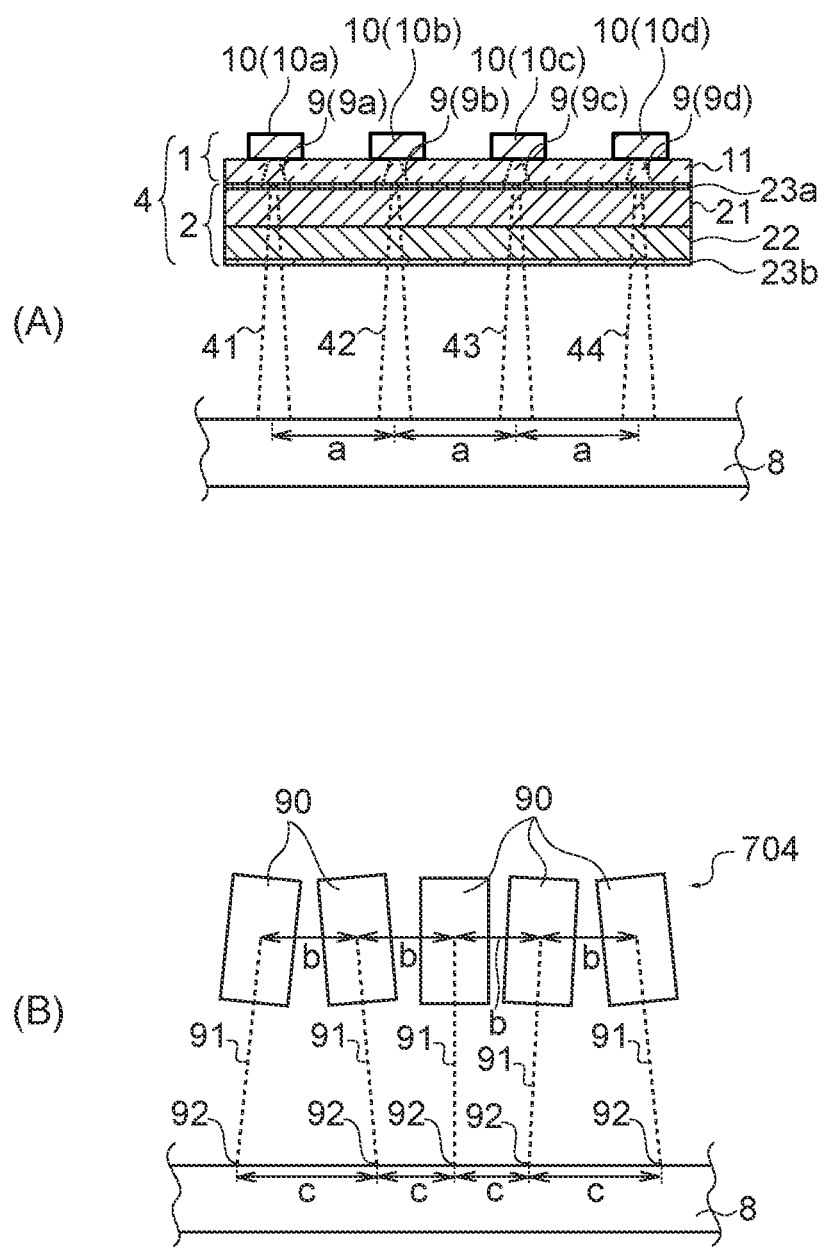
FIG. 13 is a schematic diagram for describing irradiation spot positions of the pulsed laser beams from the laser light source according to the present technology and irradiation spot positions of pulsed laser beams from a laser light source according to a comparative example.

(A) of FIG. 13 is a schematic diagram for describing the irradiation positions of the pulsed laser beams 41 to 44 oscillated from the laser light source 4 of this embodiment. (B) of FIG. 13 is a schematic diagram for describing the irradiation positions of the pulsed laser beams 91 oscillated from a laser light source group 704 as a comparative example. Note that the illustration of the optical system is omitted in FIG. 13.

In the example shown in (B) of FIG. 13, the laser light source group 704 has a configuration in which a plurality of, for example, five single beam microchip laser light sources 90 independent of each other is arranged in a one-dimensional array. From each single beam microchip laser light source 90, one pulsed laser beam 91 is oscillated.

As shown in (B) of FIG. 13, when the plurality of single beam microchip laser light sources 90 is arranged to constitute the laser light source group 704, for example, an arrangement pitch b of the single beam microchip laser light sources 90 may be unequally set, and a pitch deviation may occur. In such a case, irradiation positions 92 of the plurality of pulsed laser beams 91 fail to have a predetermined interval c, which makes it difficult to obtain a laser processing machine with a stable processing accuracy.

Further, as shown in (B) of FIG. 13, the single beam microchip laser light sources 90 may be disposed inclined from the normal position and may not be oscillated in parallel, though the plurality of pulsed laser beams 91 should be oscillated in parallel from the laser light source group 704 originally. In such a case, the irradiation positions 92 cannot be equally spaced, and as the distance between the processing position and the laser light source group 704 becomes longer, the deviation of the irradiation position 92 of the pulsed laser beam 91 occurs largely. This makes it difficult to stabilize the processing accuracy.

In contrast, in this embodiment, as shown in (A) of FIG. 13, the light emitting body 1 and the picosecond generating cavity 2 are stacked to constitute the laser light source 4.

The light emitting body 1 includes the plurality of VCSEL elements 10, which emits excitation light beams, formed on the same substrate 11 using a photolithography technique at a positional accuracy of 1 μm or less. The arrangement pitch of the VCSEL elements 10 is an equal interval.

The picosecond generating cavity 2 is constituted by stacking the gain medium 21 and the supersaturated absorber 22, which are respectively polished with high accuracy, to take a rectangular parallelepiped shape in which the surfaces thereof facing each other are parallel.

By such a light emitting body 1 and a picosecond generating cavity 2 in which the planar surfaces thereof are stacked in contact with each other, the directions of the pulsed laser beams oscillated from the laser light source 4 is determined, and the emission directions of the pulsed laser beams oscillated on the basis of the excitation lights emitted from the individual VCSEL elements 10 can be made parallel to each other.

Therefore, as shown in (A) of FIG. 13, the parallelism of the plurality of pulsed laser beams 41 to 44 oscillated from the laser light source 4 is held, and it is possible to set the intervals a of the irradiation positions of the pulsed laser beams to be equal, and to obtain a laser light source 4 with high accuracy in the irradiation position of the pulsed laser beam.

When the laser processing machine is constituted using such a laser light source, it is possible to obtain the laser processing machine capable of high-accuracy laser processing.

Further, since the laser light source of this embodiment is configured to be capable of oscillating a plurality of pulsed laser beams, it is not necessary to provide an optical system for branching a laser beam oscillated from one laser light source into a plurality of laser beams. Thus, it is possible to miniaturize the laser processing machine and to simplify the configuration of the laser processing machine. Further, since it is possible to obtain a plurality of pulsed laser beams from one laser light source, it is not necessary to provide a plurality of laser light sources each oscillating one beam, and it is possible to reduce the cost.

Further, as described above, since the plurality of VCSEL elements is formed using a photolithography technique, the VCSEL elements can be formed at a high-accuracy arrangement pitch. Therefore, since the pulsed laser beams oscillated from the laser light source 4 also have high irradiation accuracy, it is easy to mount and adjust the laser light source 4 onto the laser processing machine.

Further, by using the VCSEL elements as the excitation light source constituting a part of the laser light source 4, it is possible to reduce the size of the laser light source. That is, since the light beam emitted from the VCSEL element is a circular beam, an optical system for beam forming is unnecessary. This make it possible to achieve miniaturization.

Further, as described above, it is possible to form the plurality of VCSEL elements on the same substrate using a photolithography technique, and divide the resultant one, thus collectively producing a plurality of light emitting bodies. Further, as described above, it is also possible to produce a laminate, in which the mirror-coated gain medium 21 and supersaturated absorber 22 are stacked, on the back side of the substrate 11 on which the plurality of VCSEL elements 10 is formed, and divide the resultant one, thus collectively producing a plurality of laser light sources 4.

Thus, it is possible to stably obtain a laser light source without variations in irradiation accuracy of the pulsed laser beam between different laser light sources.

When the laser processing machine is formed using such a laser light source, it is possible to stably obtain a laser processing machine without variations in processing accuracy between different laser processing machines.

Further, since the light emitting body 1 and the picosecond generating cavity 2 are in contact with each other in the laser light source 4, it is possible to reduce the size of the laser light source 4.

The configuration of the laser light source 4 is not limited to the above-mentioned configuration, and may be configurations shown in the following second to fifth embodiments, for example. The laser light source shown in each of the following embodiments is also a laser oscillator that emits a plurality of pulsed laser beams having a pulse width in the picosecond range (1 ps to 1000 ps).

In the following embodiments, a configuration different from that of the laser light source described above will be mainly described.

Second Embodiment

Figure 9:
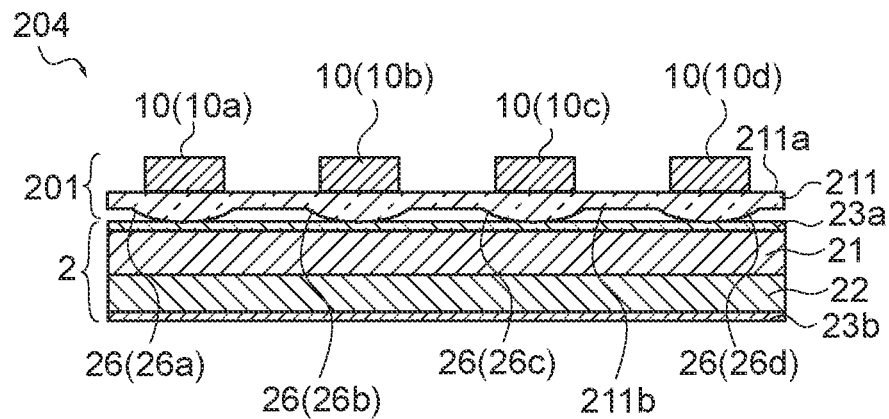
FIG. 9 is a schematic cross-sectional view of a laser light source according to a second embodiment.

FIG. 9 is a schematic cross-sectional view of a laser light source 204 used in the laser processing machine according to the present technology.

As shown in FIG. 9, the laser light source 204 includes a light emitting body 201, a picosecond generating cavity 2, and a controller 3 (not shown).

The light emitting body 201 of this embodiment differs from the light emitting body 1 of the first embodiment only in the shape of the substrate supporting the respective layers of the VCSEL elements 10.

A substrate 211 constituting a part of the light emitting body 201 in this embodiment has one surface 211a and the other surface 211b facing each other.

Four VCSEL elements 10a to 10d are formed by sharing the substrate 211. The light emitting body 201 has a configuration in which a plurality of VCSEL elements 10 is provided on the one surface 211a of the same substrate 211.

The other surface 211b from which excitation light is emitted has a lens array shape in which a plurality of (in this embodiment, four) condensing lenses 26a to 26d respectively corresponding to the VCSEL elements 10a to 10d is arranged in a one-dimensional array.

Note that, in this embodiment, the four condensing lenses are denoted by reference symbols 26a to 26d, but if it is not necessary to particularly distinguish from each other, they will be described as the condensing lens(es) 26.

The light emitting body 201 is arranged such that the other surface 211b of the substrate 211 is in contact with the picosecond generating cavity 2. The light emitting body 201 and the picosecond generating cavity 2 are fixed in contact with each other by a housing (not shown).

The condensing lens 26a condenses the excitation light beam emitted from the corresponding VCSEL element 10a, and emits it to the picosecond generating cavity 2.

The condensing lens 26b condenses the excitation light beam emitted from the corresponding VCSEL element 10b, and emits it to the picosecond generating cavity 2.

The condensing lens 26c condenses the excitation light beam emitted from the corresponding VCSEL element 10c, and emits it to the picosecond generating cavity 2.

The condensing lens 26d condenses the excitation light beam emitted from the corresponding VCSEL element 10d, and emits it to the picosecond generating cavity 2.

As described above, the substrate 211 provided with the other surface 211b having the shape of the condensing lens array corresponds to a condensing member, and the light emitting body 201 is a light emitting body with an optical member, which includes the condensing member as an optical member.

In this embodiment, the example in which a plurality of VCSEL elements is one-dimensionally arranged is described, and thus the other surface 211b of the substrate 211 has a lens array shape of a one-dimensional array. If the VCSEL elements are arranged two-dimensionally, the condensing lenses are arranged to correspond to the respective VCSEL elements, and thus the other surface has a condensing lens array shape of a two-dimensional array.

In such a manner, the condensing member is provided, and thus it is possible to use the excitation light emitted to the picosecond generating cavity 2 as excitation light having a condensing diameter at which efficient oscillation characteristics are obtained in the picosecond generating cavity 2.

In this embodiment, the condensing diameter of the excitation light beams emitted to the picosecond generation cavity 2 by the condensing lenses 26a to 26d is set to 100 μm at which the pulsed laser beams are likely to be oscillated in the Yd:YAG used for the gain medium 21. Thus, it is possible to obtain a laser light source with efficient oscillation characteristics.

The effect of providing the condensing member is the same as in the following third to fifth embodiments.

Further, in this embodiment, the VCSEL element is of the bottom emission type in which excitation light is emitted from the back side of the substrate. Thus, only when the substrate for supporting the VCSEL elements is molded into a lens array shape, a light emitting body having a condensing function can be provided, and the laser light source can be miniaturized.

Third Embodiment

Figure 10:
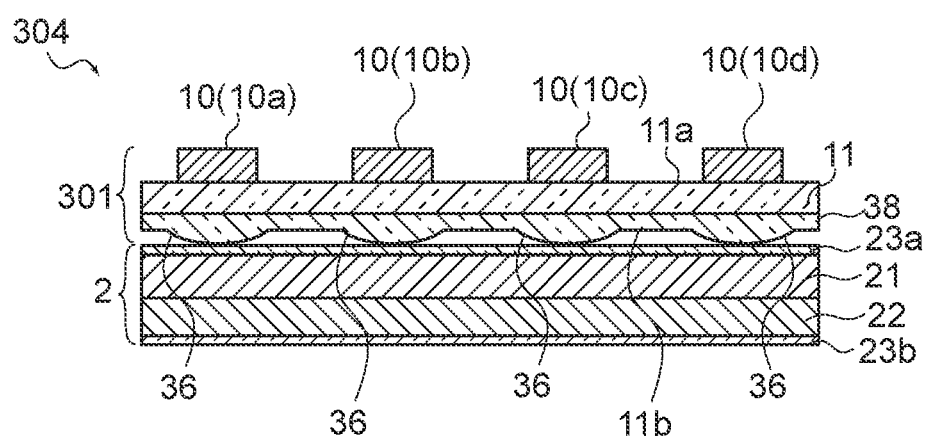
FIG. 10 is a schematic cross-sectional view of a laser light source according to a third embodiment.

In the second embodiment, the other surface of the substrate for supporting the VCSEL elements has a condensing lens array shape, but as in this embodiment shown in FIG. 10, the following configuration may be provided, in which the other surface of the substrate does not have the condensing lens array shape, and a condensing lens array substrate formed of a different member from the substrate for supporting the VCSEL elements is separately provided.

FIG. 10 is a schematic cross-sectional view of a laser light source 304 used in the laser processing machine according to the present technology.

As shown in FIG. 10, the laser light source 304 includes a light emitting body 301, a picosecond generating cavity 2, and a controller 3 (not shown).

The light emitting body 301 includes a plurality of VCSEL elements 10 formed by sharing a substrate 11, and a condensing lens array substrate 38 as a condensing member disposed in contact with the other surface 11b of the substrate 11.

The light emitting body 301 is a light emitting body with an optical member, which includes the condensing member as an optical member.

The condensing lens array substrate 38 and the substrate 11 may be bonded to each other or may be fixed in contact with each other by a housing (not shown).

Both the condensing lens array substrate 38 of the light emitting body 301 and the picosecond generating cavity 2 are fixed in contact with each other by a housing (not shown).

The light emitting body 301 has a condensing lens array shape in which a plurality of (in this embodiment, four) condensing lenses 36 corresponding to the respective VCSEL elements 10a to 10d is arranged in a one-dimensional array.

In such a manner, an external condensing lens array substrate 38 may be provided.

Fourth Embodiment

In the second and third embodiments, the example of providing a condensing member has been described. However, in addition to the condensing member, a configuration to further provide a collimating member for collimating the excitation light beams emitted from the VCSEL elements 10 may be provided.

Figure 11:
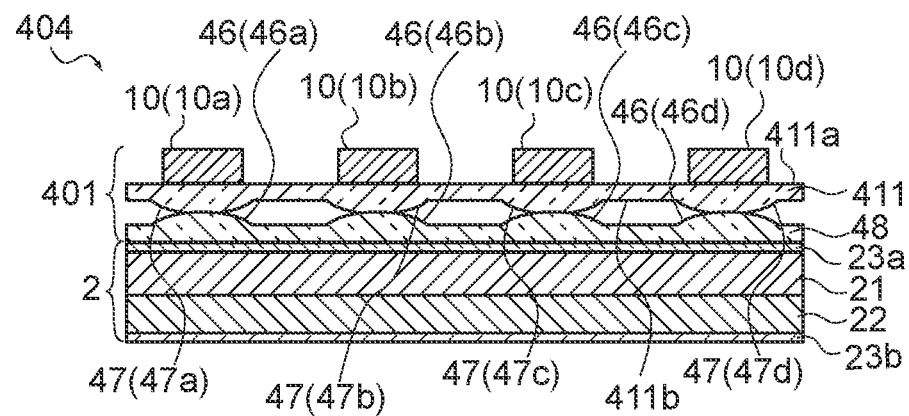
FIG. 11 is a schematic cross-sectional view of a laser light source according to a fourth embodiment.

FIG. 11 is a schematic cross-sectional view of a laser light source 404 used in the laser processing machine according to the present technology.

As shown in FIG. 11, the laser light source 404 includes a light emitting body 401, a picosecond generating cavity 2, and a controller 3 (not shown).

The light emitting body 401 includes a plurality of VCSEL elements 10 formed by sharing a substrate 411, and a condensing lens array substrate 48.

The substrate 411 has one surface 411a and the other surface 411b facing each other.

The plurality of VCSEL elements 10 is provided on the one surface 411a.

The other surface 411b from which the excitation light is emitted has a collimating lens array shape in which a plurality of (in this embodiment, four) collimating lenses 47a to 47d corresponding to the respective VCSEL elements 10a to 10d is arranged in a one-dimensional array.

The collimating lens 47a collimates the excitation light beam emitted from the corresponding VCSEL elements 10a, and emits it to the collimating lens array substrate 402. Similarly, the collimating lens 47b collimates the excitation light beam emitted from the corresponding VCSEL element 10b, the collimating lens 47c collimates the excitation light beam emitted from the corresponding VCSEL element 10c, and the collimating lens 47d collimates the excitation light beam emitted from the corresponding VCSEL element 10d, to emit them to the condensing lens array substrate 48.

Thus, the substrate 411 corresponds to a collimating member.

Note that, in this embodiment, the four collimating lenses are denoted by reference symbols 47a to 47d, but if it is not necessary to particularly distinguish from each other, they will be described as the collimating lens(es) 47.

The condensing lens array substrate 48 corresponding to the condensing member is disposed in contact with the other surface 411b of the substrate 411.

The condensing lens array substrate 48 has a condensing lens array shape in which a plurality of (in this embodiment, four) condensing lenses 46a to 46d corresponding to the respective VCSEL elements 10a to 10d is arranged in a one-dimensional array. The condensing lenses 46a to 46d and the collimating lenses 47a to 47d are arranged so as to respectively overlap each other.

The condensing lens 46a condenses the light beam emitted from the corresponding VCSEL element 10a and collimated by the collimating lens 47a, and emits it to the picosecond generating cavity 2.

The condensing lens 46b emits the light beam emitted from the corresponding VCSEL element 10b and collimated by the collimating lens 47b to the picosecond generating cavity 2.

The condensing lens 46c emits the light beam emitted from the corresponding VCSEL element 10c and collimated by the collimating lens 47c to the picosecond generating cavity 2.

The condensing lens 46d condenses the light beam emitted from the corresponding VCSEL element 10d and collimated by the collimating lens 47d, and emits it to the picosecond generating cavity 2.

The condensing lens array substrate 48 is disposed between the substrate 411 and the picosecond generating cavity 2. The condensing lens array substrate 48 is bonded to the picosecond generating cavity 2 or fixed to be positioned in contact with the picosecond generating cavity 2 by a housing. The condensing lens array substrate 48 and the light emitting body 401 are fixed in contact with each other by a housing.

The light emitting body 401 is a light emitting body with an optical member, which includes the condensing member and the collimating member as optical members.

In such a manner, when the collimating member is provided, the convergent light and divergent light, which do not contribute to the oscillation of the pulsed laser beam in the gain medium and which have been included in the excitation light, are eliminated, and the pulsed laser beam is efficiently oscillated. That is, the convergent light and divergent light absorbed in the gain medium are converted into heat and interfere with the oscillation of the pulsed laser beam, but when the excitation light is collimated, the pulsed laser beam is efficiently oscillated.

Fifth Embodiment

Figure 12:
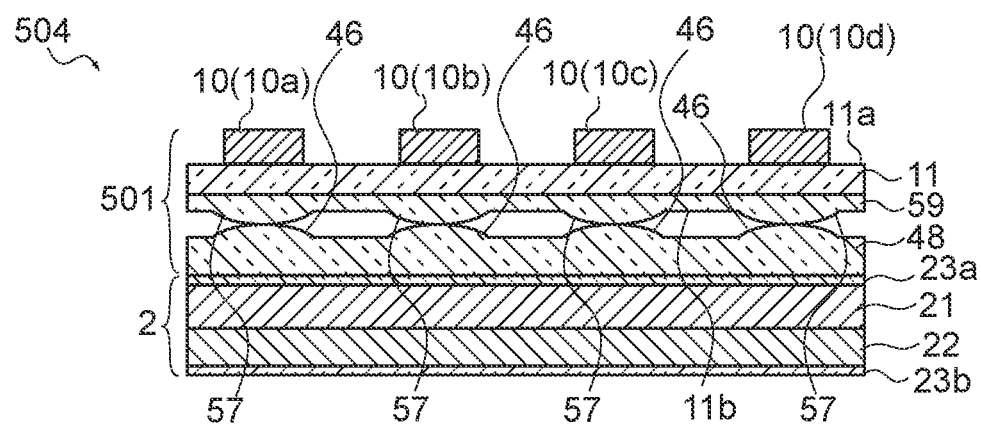
FIG. 12 is a diagram for describing a scanning example of a laser light source according to a fifth embodiment.

In the fourth embodiment, the other surface of the substrate for supporting the VCSEL elements 10 has a collimating lens array shape, but as in this embodiment shown in FIG. 12, the following configuration may be provided, in which the other surface of the substrate does not have the lens array shape, and a collimating lens array substrate formed of a different member from the substrate for supporting the VCSEL elements 10 is separately provided.

FIG. 12 is a schematic cross-sectional view of a laser light source 504 used in the laser processing machine according to the present technology.

As shown in FIG. 12, the laser light source 504 includes a light emitting body 501, a picosecond generating cavity 2, and a controller 3 (not shown).

The light emitting body 501 includes a plurality of VCSEL elements 10 formed by sharing a substrate 11, a collimating lens array substrate 59 as a collimating member, and a condensing lens array substrate 48 as a condensing member.

The light emitting body 501 is a light emitting body with an optical member, which includes the condensing member and the collimating member as optical members.

The collimating lens array substrate 59 is disposed in contact with the other surface 11b of the substrate 11. The collimating lens array substrate 59 is bonded to the light emitting body 501 or fixed to be positioned in contact with the light emitting body 501 by a housing.

The collimating lens array substrate 59 has a collimating lens array shape in which a plurality of (in this embodiment, four) collimating lenses 57 corresponding to the respective VCSEL elements 10a to 10d is arranged in a one-dimensional array.

In such a manner, an external collimating lens array substrate 59 can be provided.

Sixth Embodiment

Figure 14:
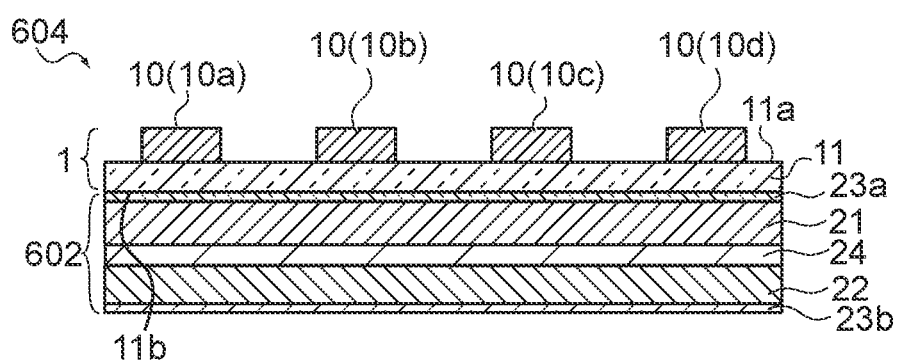
FIG. 14 is a schematic cross-sectional view of a laser light source according to a sixth embodiment.

FIG. 14 is a schematic cross-sectional view of a laser light source in this embodiment.

As shown in FIG. 14, the picosecond generating cavity of the laser light source may be configured to include a dielectric multilayer film 24 between a gain medium 21 and a supersaturated absorber 22.

As shown in FIG. 14, a laser light source 604 includes a light emitting body 1, a picosecond generating cavity 602, and a controller 3 (not shown).

The picosecond generating cavity 602 as a cavity is provided in contact with the other surface 11b of a substrate 11 of the light emitting body 1. The picosecond generating cavity 602 oscillates an ultrashort pulsed laser beam of the pulse width in the picosecond region by the incidence of an excitation light beam 9 emitted from the light emitting body 1.

The picosecond generating cavity 602 includes the gain medium 21, the supersaturated absorber 22, the dielectric multilayer film 24 disposed between the gain medium 21 and the supersaturated absorber 22, and a pair of cavity mirrors 23a and 23b.

The dielectric multilayer film 24 is a film having a function of having a reflectance of 99% or more with respect to the excitation light wavelength and having a transmittance of 95% or more with respect to the oscillation light wavelength (laser light wavelength).

Note that, in the design of the dielectric multilayer film 24, it is more favorable that both the reflectance and the transmittance are close to 100%. However, in order to suppress the occurrence of malfunction due to leakage of the excitation light to be described later, it is favorable that a high reflectance with respect to the excitation light wavelength has priority over the transmittance with respect to the oscillation light wavelength.

When the dielectric multilayer film 24 is provided, the excitation light incident on the dielectric multilayer film 24 through the gain medium 21 is reflected by the dielectric multilayer film 24 and then incident again on the gain medium 21. Thus, the gain medium 21 absorbs the excitation light reciprocating in the thickness direction. Therefore, when the dielectric multilayer film 24 is provided, it is possible to reduce the thickness of the gain medium 21 and to reduce the cost of the material.

Furthermore, the pulse width of the pulsed laser beam oscillated from the laser light source 604 depends on the cavity length (the distance between the pair of cavity mirrors 23a and 23b). Thus, when the thickness of the gain medium 21 is reduced, it is possible to shorten the pulse more.

Here, if the excitation light is not sufficiently absorbed by the gain medium 21, the excitation light enters the supersaturated absorber 22, which results in malfunction of the Q switch of the supersaturated absorber 22.

In contrast, in this embodiment, since the dielectric multilayer film 24 is provided, it is possible to suppress the leakage of the excitation light to the supersaturated absorber 22 and to suppress the occurrence of malfunction of the Q switch. Therefore, it is possible to obtain the laser light source 604 with stable operating characteristics.

The embodiments of the present technology are not limited to the above-mentioned embodiments, and various modifications can be made without departing from the gist of the present technology.

For example, although the laser light source including the light emitting body including the plurality of VCSEL elements has been exemplified in the above embodiments, a laser light source including a light emitting body including one VCSEL element may be used.

Further, although the example of providing a condensing lens or collimating lens to each VCSEL element in a one-to-one relation has been described in the embodiments of the light emitting body with an optical member, a configuration to provide a single condensing lens or collimating lens to a plurality of VCSEL elements may be provided.

Further, in the laser processing machine, it may be possible to make the presence or absence of arrangement of the wavelength conversion layer selectable or make the wavelength conversion layer exchangeable. Further, it may be possible to arbitrarily set the arrangement position of the wavelength conversion layer with respect to the laser light source such that a pulsed laser beam for a portion to be subjected to wavelength conversion can be selected from a plurality of pulsed laser beams oscillated from the laser light source.

This makes it possible to perform processing suitable for a workpiece.

In the laser processing machine, it may be possible to make the presence or absence of arrangement of the transparent member selectable or make the transparent member having a different thickness for each portion exchangeable.

This makes it possible to perform processing suitable for a workpiece.

Note that the present technology may take the following configurations.

(1) A laser processing machine, including:
a laser light source including
a light emitting body including a substrate and a bottom emission type vertical-cavity surface-emitting laser element that is provided on one surface of the substrate and emits an excitation light beam from another surface side of the substrate, and
a cavity that is disposed in contact with the light emitting body on the other surface side of the substrate and oscillates a pulsed laser beam by incidence of the excitation light beam; and
an optical system that causes the pulsed laser beam to contract and applies the pulsed laser beam to a workpiece.

(2) The laser processing machine according to (1), in which
the light emitting body includes a plurality of the vertical-cavity surface-emitting laser elements.

(3) The laser processing machine according to (1) or (2), in which
the cavity includes
a gain medium layer that is excited by the excitation light beams and oscillates laser beams,
a supersaturated absorber, and
a pair of mirrors sandwiching the gain medium layer and the supersaturated absorber.

(4) The laser processing machine according to any one of (1) to (3), further including
a wavelength conversion layer provided between the laser light source and the optical system.

(5) The laser processing machine according to any one of (1) to (4), further including
a transparent member provided between the optical system and the workpiece and having a different thickness for each portion.

(6) The laser processing machine according to any one of (1) to (5), in which
the light emitting body includes a condensing member that condenses and emits the excitation light beams to the cavity.

(7) The laser processing machine according to any one of (1) to (5), in which
the light emitting body includes
a collimating member that collimates and emits the excitation light beams, and
a condensing member that condenses and emits light emitted from the collimating member to the cavity.

(8) The laser processing machine according to any one of (1) to (7), further including
a controller that controls oscillation of the pulsed laser beams from the laser light source.

(9) The laser processing machine according to (8), in which
the controller individually controls emission of the pulsed laser beams based on the excitation light beams respectively emitted from the plurality of vertical-cavity surface-emitting laser elements.

(10) The laser processing machine according to any one of (1) to (9), in which
the gain medium layer is Yb:YAG.

(11) The laser processing machine according to any one of (1) to (10), in which
the supersaturated absorber is Cr:YAG.

(12) A laser processing method, including
by using a laser processing machine including
a laser light source including
a light emitting body including a substrate and a plurality of bottom emission type vertical-cavity surface-emitting laser elements that is provided on one surface of the substrate and emits excitation light beams from another surface side of the substrate, and
a cavity that is disposed in contact with the light emitting body on the other surface side of the substrate and oscillates a plurality of pulsed laser beams by incidence of the excitation light beams, and
an optical system that causes the pulsed laser beams to contract and applies the pulsed laser beams to a workpiece,
processing the workpiece by irradiating the workpiece with the pulsed laser beams at respectively different oscillation timings, the pulsed laser beams being oscillated on the basis of the excitation light beams respectively emitted from the vertical-cavity surface-emitting laser elements adjacent to each other.

(13) The laser processing method according to (12), in which
the oscillation timings of the pulsed laser beams based on the excitation light beams respectively emitted from the vertical-cavity surface-emitting laser elements adjacent to each other are shifted by a half period of a pulse period of the pulsed laser beams.

(14) A laser processing method, including
by using a laser processing machine including
a laser light source including
a light emitting body including a substrate and a plurality of bottom emission type vertical-cavity surface-emitting laser elements that is provided on one surface of the substrate and emits excitation light beams from another surface side of the substrate, and
a cavity that is disposed in contact with the light emitting body on the other surface side of the substrate and oscillates a plurality of pulsed laser beams by incidence of the excitation light beams,
an optical system that causes the pulsed laser beams to contract and applies the pulsed laser beams to a workpiece, and
a wavelength conversion layer provided between the laser light source and the optical system,
processing the workpiece by irradiating the workpiece with a pulsed laser beam that is emitted from the cavity and does not pass through the wavelength conversion layer and a pulsed laser beam having a wavelength converted by passing through the wavelength conversion layer.

(15) A laser processing method, including
by using a laser processing machine including
a laser light source including
a light emitting body including a substrate and a plurality of bottom emission type vertical-cavity surface-emitting laser elements that is provided on one surface of the substrate and emits excitation light beams from another surface side of the substrate, and
a cavity that is disposed in contact with the light emitting body on the other surface side of the substrate and oscillates a plurality of pulsed laser beams by incidence of the excitation light beams,
an optical system that causes the pulsed laser beams to contract and applies the pulsed laser beams to a workpiece, and
a transparent member provided between the optical system and the workpiece and having a different thickness for each portion,
processing the workpiece by irradiating the workpiece with a plurality of pulsed laser beams formed by the transparent member and having different focal lengths.

(16) A laser processing method, including
by using a laser processing machine including
a laser light source including
a light emitting body including a substrate and a plurality of bottom emission type vertical-cavity surface-emitting laser elements that is provided on one surface of the substrate and emits excitation light beams from another surface side of the substrate, and
a cavity that is disposed in contact with the light emitting body on the other surface side of the substrate and oscillates a plurality of pulsed laser beams by incidence of the excitation light beams,
an optical system that causes the pulsed laser beams to contract and applies the pulsed laser beams to a workpiece,
a wavelength conversion layer provided between the laser light source and the optical system, and
a transparent member provided between the optical system and the workpiece and having a different thickness for each portion,
processing the workpiece formed by stacking a first material to be processed at a first processing wavelength and a second material to be processed at a second processing wavelength, the first processing wavelength and the second processing wavelength being different from each other, by irradiating the workpiece with a first pulsed laser beam having the first processing wavelength that is emitted from the cavity and does not pass through the wavelength conversion layer and a second pulsed laser beam having the second processing wavelength converted by passing through the wavelength conversion layer, with focal lengths varied by the transparent member such that a focal position of the first pulsed laser beam is on the first material and a focal position of the second pulsed laser beam is on the second material.

(17) A laser light source, including:
a light emitting body including a substrate and a bottom emission type vertical-cavity surface-emitting laser element that is provided on one surface of the substrate and emits an excitation light beam from another surface side of the substrate; and
a cavity that is disposed in contact with the light emitting body on the other surface side of the substrate and oscillates a pulsed laser beam by incidence of the excitation light beam.

REFERENCE SIGNS LIST 1, 201, 301, 401, 501 light emitting body
2, 602 picosecond generating cavity (cavity)
3 controller 4, 204, 304, 404, 504, 604 laser light source
5 optical system
6 wavelength conversion layer
7 transparent member having different thickness for each portion
8 workpiece
9, 9a to 9d excitation light beam
10, 10a to 10d VCSEL element (vertical-cavity surface-emitting laser element)
11 substrate
11a one surface
11b the other surface
21 gain medium layer
22 supersaturated absorber
23a, 23b cavity mirror (mirror)
38, 48 condensing lens array substrate (condensing member)
41 to 44, 63, 64 pulsed laser beam
59 collimating lens array substrate (collimating member)
100, 600 laser processing machine
211 substrate(condensing member)
211a one surface
211b the other surface
411 substrate (collimating member)
411a one surface
411b the other surface

What is claimed is:

1. A laser processing machine, comprising: a laser light source, including: a light emitting body including a substrate and a plurality of bottom emission type vertical-cavity surface-emitting laser elements that are provided on a first surface of the substrate and that each emit an excitation light beam that is output from a second surface side of the substrate; and
a cavity that is disposed in contact with the light emitting body on the other second surface side of the substrate and oscillates a-pulsed laser beams by incidence of the excitation light beams,
wherein the cavity includes a gain medium layer that is excited by the excitation light beams and oscillates laser beams, a supersaturated absorber, and a pair of mirrors sandwiching the gain medium layer and the supersaturated absorber; and
an optical system that causes the pulsed laser beams to contract and applies the pulsed laser beams to a workpiece.

2. The laser processing machine according to claim 1, further comprising:
a wavelength conversion layer provided between the laser light source and the optical system.

3. The laser processing machine according to claim 1, further comprising
a transparent member provided between the optical system and the workpiece and having a different thickness for each portion.

4. The laser processing machine according to claim 1, wherein
the light emitting body includes a condensing member that condenses and emits the excitation light beams to the cavity.

5. The laser processing machine according to claim 1, wherein
the light emitting body includes
a collimating member that collimates and emits the excitation light beams, and
a condensing member that condenses and emits light emitted from the collimating member to the cavity.

6. The laser processing machine according to claim 1, further comprising:
a controller that controls oscillation of the pulsed laser beams from the laser light source.

7. The laser processing machine according to claim 6, wherein
the controller individually controls emission of the pulsed laser beams based on the excitation light beams respectively emitted from the plurality of vertical-cavity surface-emitting laser elements.

8. The laser processing machine according to claim 1, wherein
the gain medium layer is Yb:YAG.

9. The laser processing machine according to claim 8, wherein
the supersaturated absorber is Cr:YAG.

10. A laser processing method, comprising; by using a laser processing machine, including; a laser light source, including; a light emitting body including a substrate and a plurality of bottom emission type vertical-cavity surface-emitting laser elements that is provided on a first surface of the substrate and emits excitation light beams from a second surface side of the substrate, and
a cavity that is disposed in contact with the light emitting body on the second surface side of the substrate and oscillates a plurality of pulsed laser beams by incidence of the excitation light beams,
wherein the cavity includes a gain medium layer that is excited by the excitation light beams and oscillates laser beams, a supersaturated absorber, and a pair of mirrors sandwiching the gain medium layer and the supersaturated absorber;
and an optical system that causes the pulsed laser beams to contract and applies the pulsed laser beams to a workpiece, processing the workpiece by irradiating the workpiece with the pulsed laser beams at respectively different oscillation timings, the pulsed laser beams being oscillated on a basis of the excitation light beams respectively emitted from the vertical- cavity surface-emitting laser elements adjacent to each other.

11. The laser processing method according to claim 10, wherein
the oscillation timings of the pulsed laser beams based on the excitation light beams respectively emitted from the vertical-cavity surface-emitting laser elements adjacent to each other are shifted by a half period of a pulse period of the pulsed laser beams.

12. The laser processing machine according to claim 2, wherein a surface of the wavelength conversion layer is in contact with a surface of the laser light source.

13. The laser processing machine according to claim 2, wherein a first one of the pulsed laser beams originating as an output of a first one of the vertical-cavity surface-emitting laser elements passes through the wavelength conversion layer, and wherein as second one of the pulsed laser beams originating as an output of a second one of the vertical-cavity surface-emitting laser elements does not pass through the wavelength conversion layer.

* * * * *